United States Patent
Kippenberg et al.

(10) Patent No.: US 10,191,215 B2
(45) Date of Patent: Jan. 29, 2019

(54) WAVEGUIDE FABRICATION METHOD

(71) Applicant: Ecole Polytechnique Fédérale de Lausanne (EPFL), Lausanne (CH)

(72) Inventors: Tobias Kippenberg, Lausanne (CH); Martin Hubert Peter Pfeiffer, Lausanne (CH); Arne Kordts, Crissier (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 15/145,968

(22) Filed: May 4, 2016

(65) Prior Publication Data

US 2016/0327743 A1    Nov. 10, 2016

Related U.S. Application Data

(60) Provisional application No. 62/156,923, filed on May 5, 2015, provisional application No. 62/253,186, filed on Nov. 10, 2015.

(51) Int. Cl.

| | |
|---|---|
| *H01P 3/16* | (2006.01) |
| *H01L 33/12* | (2010.01) |
| *H01L 21/04* | (2006.01) |
| *G02B 6/132* | (2006.01) |
| *G02B 6/136* | (2006.01) |
| *G02B 6/122* | (2006.01) |

(Continued)

(52) U.S. Cl.
CPC ............ *G02B 6/132* (2013.01); *G01M 11/30* (2013.01); *G02B 6/122* (2013.01); *G02B 6/1228* (2013.01); *G02B 6/136* (2013.01);

*H01L 21/042* (2013.01); *H01L 21/0475* (2013.01); *H01L 33/12* (2013.01); *H01P 3/16* (2013.01); *G02B 2006/12038* (2013.01)

(58) Field of Classification Search
None
See application file for complete search history.

(56) References Cited

U.S. PATENT DOCUMENTS

| | | |
|---|---|---|
| 4,636,400 A | 1/1987 | Nishioka et al. |
| 5,640,041 A | 6/1997 | Lur et al. |

(Continued)

FOREIGN PATENT DOCUMENTS

| | | |
|---|---|---|
| GB | 2326280 A | 12/1998 |
| JP | S6169333 A | 4/1986 |

(Continued)

OTHER PUBLICATIONS

Akhmediev, N., & Karlsson, M. (1995). Cherenkov radiation emitted by solitons in optical fibers. Physical Review A, 51(3), 2602.

(Continued)

*Primary Examiner* — Stephanie P Duclair
(74) *Attorney, Agent, or Firm* — Andre Roland S.A.; Nikolaus Schibli

(57) ABSTRACT

A waveguide fabrication method including the steps of providing a substrate including at least one waveguide recess structure and a stress release recess structure for receiving a waveguide material, and depositing the waveguide material onto the substrate and into both the waveguide recess structure and the stress release recess structure.

21 Claims, 20 Drawing Sheets

(51) Int. Cl.
  *G01M 11/00* (2006.01)
  *G02B 6/12* (2006.01)

(56) References Cited

U.S. PATENT DOCUMENTS

| | | | |
|---|---|---|---|
| 5,812,403 A * | 9/1998 | Fong | B08B 7/0035 |
| | | | 134/1.1 |
| 5,821,174 A | 10/1998 | Hong et al. | |
| 6,287,962 B1 | 9/2001 | Lin | |
| 6,774,059 B1 | 8/2004 | Chuang et al. | |
| 8,987,050 B1 * | 3/2015 | Hiner | H01L 23/49838 |
| | | | 257/E21.499 |
| 2002/0022340 A1 | 2/2002 | Lin et al. | |
| 2002/0134671 A1 * | 9/2002 | Demaray | C23C 14/14 |
| | | | 204/192.25 |
| 2003/0052082 A1 * | 3/2003 | Khan | G02B 6/122 |
| | | | 216/24 |
| 2013/0032888 A1 | 2/2013 | Murata | |
| 2013/0062727 A1 | 3/2013 | Huang et al. | |
| 2014/0061761 A1 | 3/2014 | Kubota | |
| 2015/0125111 A1 * | 5/2015 | Orcutt | G02B 6/122 |
| | | | 385/14 |

FOREIGN PATENT DOCUMENTS

| | | |
|---|---|---|
| JP | H07142432 A | 6/1995 |
| JP | H0837308 A | 2/1996 |
| JP | H10284480 A | 10/1998 |
| JP | H1174165 A | 3/1999 |
| JP | 2002343858 A | 3/2013 |

OTHER PUBLICATIONS

Biberman, A., Preston, K., Hendry, G., Sherwood-Droz, N., Chan, J., Levy, J. S., . . . & Bergman, K. (2011). Photonic network-on-chip architectures using multilayer deposited silicon materials for high-performance chip multiprocessors. ACM Journal on Emerging Technologies in Computing Systems (JETC) 7(2) 7.
Bonaccorso, F., Sun, Z., Hasan, T., & Ferrari, A. C. (2010). Graphene photonics and optoelectronics. Nature photonics, 4(9), 611-622.
Brasch, V., Chen, Q. F., Schiller, S., & Kippenberg, T. J. (2014). Radiation hardness of high-Q silicon nitride microresonators for space compatible integrated optics. Optics express, 22(25), 30786-30794.
Brasch, V., Geiselmann, M., Herr, T., Lihachev, G., Pfeiffer, M. H. P., Gorodetsky, M. L., & Kippenberg, T.J. (2016). Photonic chip-based optical frequency comb using soliton Cherenkov radiation. Science, 351(6271), 357-360.
Burr, I. W. (1942). Cumulative frequency functions. The Annals of mathematical statistics, 13(2), 215-232.
Carmon, T., Schwefel, H. G., Yang, L., Oxborrow, M., Stone, A. D., & Vahala, K. J. (2008). Static envelope patterns in composite resonances generated by level crossing in optical toroidal microcavities. Physical Review Letters, 100(10), 103905.
Chembo, Y. K., & Yu, N. (2010). Modal expansion approach to optical-frequency-comb generation with monolithic whispering-gallery-mode resonators. Physical Review A, 82(3), 033801.
Coen, S., Randle, H. G., Sylvestre, T., & Erkintalo, M. (2013). Modeling of octave-spanning Kerr frequency combs using a generalized mean-field Lugiato-Lefever model. Optics letters, 38(1), 37-39.
Dai, D., Bauters, J., & Bowers, J. E. (2012). Passive technologies for future large-scale photonic integrated circuits on silicon: polarization handling, light non-reciprocity and loss reduction. Light: Science & Applications, 1(3), e1.
Daldosso, N., Melchiorri, M., Riboli, F., Sbrana, F., Pavesi, L., Pucker, G., . . . & Lui, A. (2004). Fabrication and optical characterization of thin two-dimensional Si 3 N 4 waveguides. Materials science in semiconductor processing, 7(4), 453-458.

Del'Haye, P., Herr, T., Gavartin, E., Gorodetsky, M. L., Holzwarth, R., & Kippenberg, T. J. (2011). Octave spanning tunable frequency comb from a microresonator. Physical Review Letters, 107(6), 063901.
Del'Haye, P., Schliesser, A., Arcizet, O., Wilken, T., Holzwarth, R., & Kippenberg, T. J. (2007). Optical frequency comb generation from a monolithic microresonator. Nature, 450(7173), 1214-1217.
Del'Haye, P., Arcizet, O., Gorodetsky, M. L., Holzwarth, R., & Kippenberg, T. J. (2009). Frequency comb assisted diode laser spectroscopy for measurement of microcavity dispersion. Nature Photonics, 3(9), 529-533.
Ding, D., de Dood, M. J., Bauters, J. F., Heck, M. J., Bowers, J. E., & Bouwmeester, D. (2014). Fano resonances in a multimode waveguide coupled to a high-Q silicon nitride ring resonator. Optics express, 22(6), 6778-6790.
Epping, J. P., Hellwig, T., Hoekman, M., Mateman, R., Leinse, A., Heideman, R. G., . . . & Boller, K. J. (2015). On-chip visible-to-infrared supercontinuum generation with more than 495 THz spectral bandwidth. Optics express, 23(15), 19596-19604.
Epping, J. P., Hoekman, M., Mateman, R., Leinse, A., Heideman, R. G., van Rees, A., . . . & Boller, K. J. (2015). High confinement, high yield Si 3 N 4 waveguides for nonlinear optical applications. Optics express, 23(2), 642-648.
Ferdous, F., Miao, H., Leaird, D. E., Srinivasan, K., Wang, J., Chen, L., . . . & Weiner, A. M. (2011). Spectral line-by-line pulse shaping of on-chip microresonator frequency combs. Nature Photonics, 5(12), 770-776.
Gondarenko, A., Levy, J. S., & Lipson, M. (2009). High confinement micron-scale silicon nitride high Q ring resonator. Optics express, 17(14), 11366-11370.
Halir, R., Okawachi, Y., Levy, J. S., Foster, M. A., Lipson, M., & Gaeta, A. L. (2012). Ultrabroadband supercontinuum generation in a CMOS-compatible platform. Optics letters, 37(10), 1685-1687.
Hausmann, B. J. M., Bulu, I., Venkataraman, V., Deotare, P., & Lon•ar, M. (2014). Diamond nonlinear photonics. Nature Photonics, 8(5), 369-374.
Heck, M. J., Bauters, J. F., Davenport, M. L., Spencer, D. T., & Bowers, J. E. (2014). Ultra•low loss waveguide platform and its integration with silicon photonics. Laser & Photonics Reviews, 8(5), 667-686.
Herr, T., Brasch, V., Jost, J. D., Mirgorodskiy, I., Lihachev, G., Gorodetsky, M. L., & Kippenberg, T. J. (2014). Mode spectrum and temporal soliton formation in optical microresonators. Physical review letters, 113(12), 123901.
Herr, T., Brasch, V., Jost, J. D., Wang, C. Y., Kondratiev, N. M., Gorodetsky, M. L., & Kippenberg, T. J. (2014). Temporal solitons in optical microresonators. Nature Photonics, 8(2), 145-152.
Herr, T., Hartinger, K., Riemensberger, J., Wang, C. Y., Gavartin, E., Holzwarth, R., . . . & Kippenberg, T. J. (2012). Universal formation dynamics and noise of Kerr-frequency combs in microresonators. Nature Photonics, 6(7), 480-487.
Jost, J. D., Herr, T., Lecaplain, C., Brasch, V., Pfeiffer, M. H. P., & Kippenberg, T. J. (2015). Counting the cycles of light using a self-referenced optical microresonator. Optica, 2(8), 706-711.
Karpov, M., Guo, H., Kordts, A., Brasch, V., Pfeiffer, M. H., Zervas, M., . . . & Kippenberg, T. J. (2016). Raman Self-Frequency Shift of Dissipative Kerr Solitons in an Optical Microresonator. Physical Review Letters, 116(10), 103902.
Kippenberg, T. J., Holzwarth, R., & Diddams, S. A. (2011). Microresonator-based optical frequency combs. Science, 332(6029), 555-559.
Koonath, P., & Jalali, B. (2007). Multilayer 3-D photonics in silicon. Optics express, 15(20), 12686-12691.
Levy, J. S., Gondarenko, A., Foster, M. A., Turner-Foster, A. C., Gaeta, A. L., & Lipson, M. (2010). CMOS-compatible multiple-wavelength oscillator for on-chip optical interconnects. Nature Photonics, 4(1), 37-40.
Liang, W., Eliyahu, D., Ilchenko, V. S., Savchenkov, A. A., Matsko, A. B., Seidel, D., & Maleki, L. (2015). High spectral purity Kerr frequency comb radio frequency photonic oscillator. Nature communications, 6.
Liu, Y., Xuan, Y., Xue, X., Wang, P. H., Chen, S., Metcalf, A. J., . . . & Weiner, A. M. (2014). Investigation of mode coupling in

(56) References Cited

OTHER PUBLICATIONS normal-dispersion silicon nitride microresonators for Kerr frequency comb generation. Optica, 1(3), 137-144.
Luke, K., Dutt, A., Poitras, C. B., & Lipson, M. (2013). Overcoming Si 3 N 4 film stress limitations for high quality factor ring resonators. Optics express, 21(19), 22829-22833.
Marpaung, D., Morrison, B., Pant, R., & Eggleton, B. J. (2013). Frequency agile microwave photonic notch filter with anomalously high stopband rejection. Optics letters, 38(21), 4300-4303.
Miller, S. A., Okawachi, Y., Ramelow, S., Luke, K., Dutt, A., Farsi, A., . . . & Lipson, M. (2015). Tunable frequency combs based on dual microring resonators. Optics express, 23(16), 21527-21540.
Moss, D. J., Morandotti, R., Gaeta, A. L., & Lipson, M. (2013). New CMOS-compatible platforms based on silicon nitride and Hydex for nonlinear optics. Nature Photonics, 7(8), 597-607.
Nam, K. H., Park, I. H., & Ko, S. H. (2012). Patterning by controlled cracking. Nature, 485(7397), 221-224.
Okawachi, Y., Saha, K., Levy, J. S., Wen, Y. H., Lipson, M., & Gaeta, A. L. (2011). Octave-spanning frequency comb generation in a silicon nitride chip. Optics letters, 36(17), 3398-3400.
Oxborrow, M. (2007). Traceable 2-D finite-element simulation of the whispering-gallery modes of axisymmetric electromagnetic resonators. Microwave Theory and Techniques, IEEE Transactions on, 55(6), 1209-1218.
Pernice, W. H., Xiong, C., & Tang, H. X. (2012). High Q micro-ring resonators fabricated from polycrystalline aluminum nitride films for near infrared and visible photonics. Optics express, 20(11), 12261-12269.
Pfeiffer, M. H., Kordts, A., Brasch, V., Zervas, M., Geiselmann, M., Jost, J. D., & Kippenberg, T. J. (2016). Photonic Damascene process for integrated high-Q microresonator based nonlinear photonics. Optica, 3(1), 20-25.
Pfeifle, J., Brasch, V., Lauermann, M., Yu, Y., Wegner, D., Herr, T., . . . & Schmogrow, R. (2014). Coherent terabit communications with microresonator Kerr frequency combs. Nature photonics, 8(5), 375-380.
Pfeifle, J., Kordts, A., Marin, P., Karpov, M., Pfeiffer, M., Brasch, V., . . . & Koos, C. (May 2015). Full C and L-Band Transmission at 20 Tbit/s Using Cavity-Soliton Kerr Frequency Combs. In CLEO: Science and Innovations (pp. JTh5C-8). Optical Society of America.
Riemensberger, J., Hartinger, K., Herr, T., Brasch, V., Holzwarth, R., & Kippenberg, T. J. (2012). Dispersion engineering of thick high-Q silicon nitride ring-resonators via atomic layer deposition. Optics express, 20(25), 27661-27669.
Roelkens, G., Liu, L., Liang, D., Jones, R., Fang, A., Koch, B., & Bowers, J. (2010). III•V/silicon photonics for on•chip and intra•chip optical interconnects. Laser & Photonics Reviews, 4(6), 751-779.
Savchenkov, A. A., Matsko, A. B., Liang, W., Ilchenko, V. S., Seidel, D., & Maleki, L. (2012). Kerr frequency comb generation in overmoded resonators. Optics express, 20(24), 27290-27298.
Sun, R., Cheng, J., Michel, J., & Kimerling, L. (2009). Transparent amorphous silicon channel waveguides and high-Q resonators using a damascene process. Optics letters, 34(15), 2378-2380.
Yi, X., Yang, Q. F., Yang, K. Y., Suh, M. G., & Vahala, K. (2015). Soliton frequency comb at microwave rates in a high-Q silica microresonator. Optica, 2(12), 1078-1085.
Zhao, H., Kuyken, B., Clemmen, S., Leo, F., Subramanian, A., Dhakal, A., . . . & Baets, R. (2015). Visible-to-near-infrared octave spanning supercontinuum generation in a silicon nitride waveguide. Optics letters, 40(10), 2177-2180.
Office Action dated May 22, 2017 from the USPTO in the related case with the U.S. Appl. No. 15/442,730.

* cited by examiner

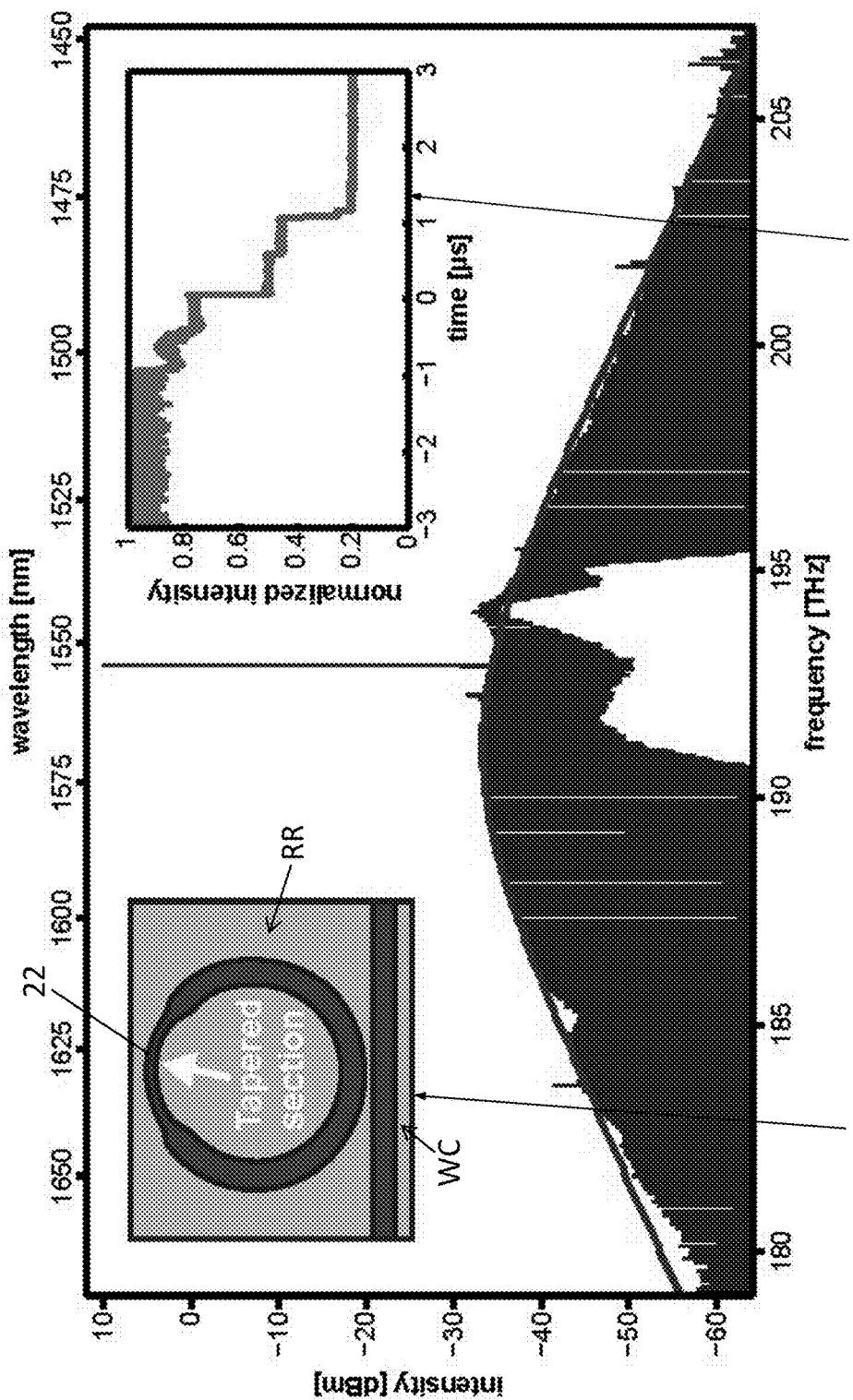

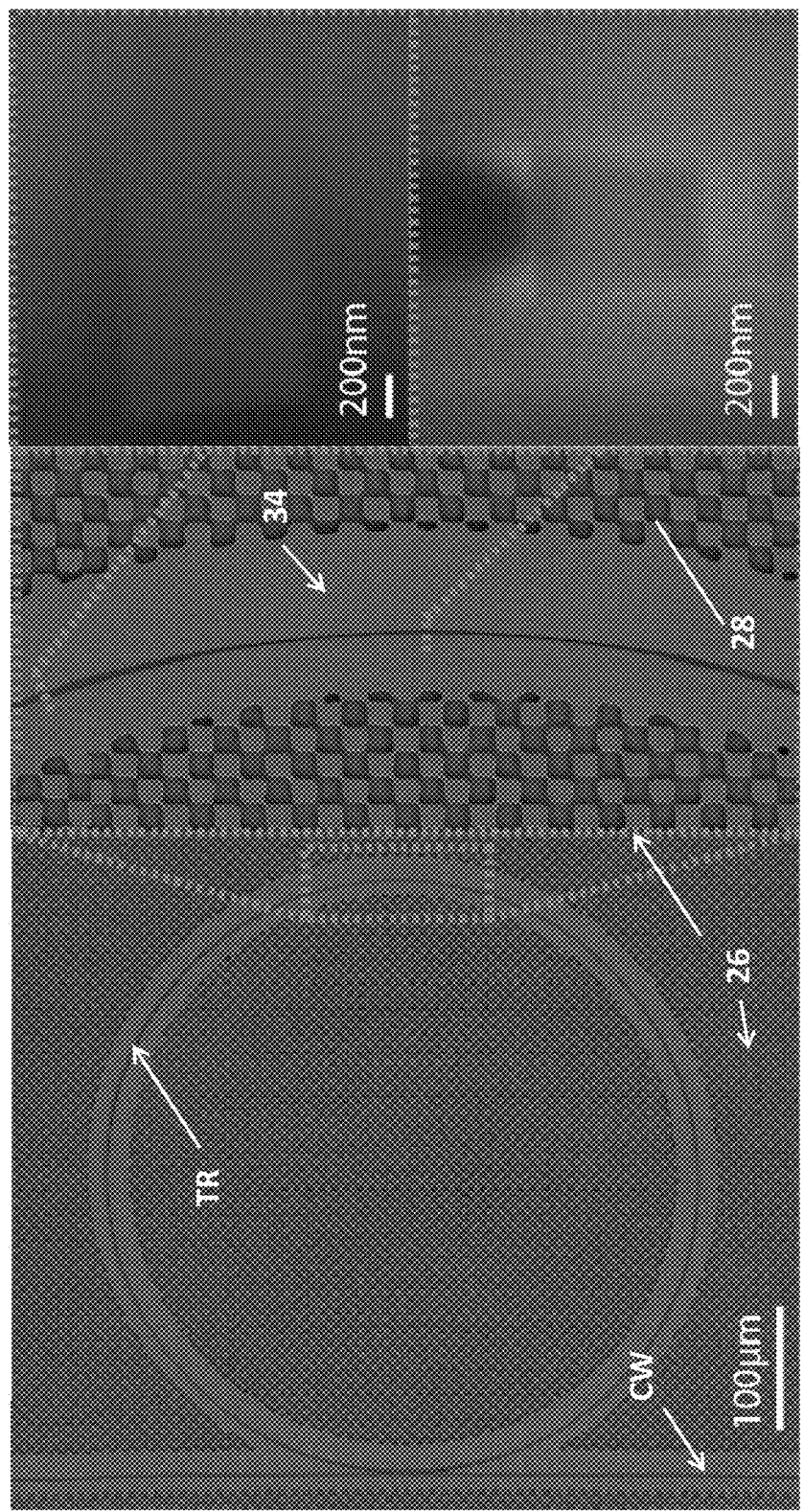

34

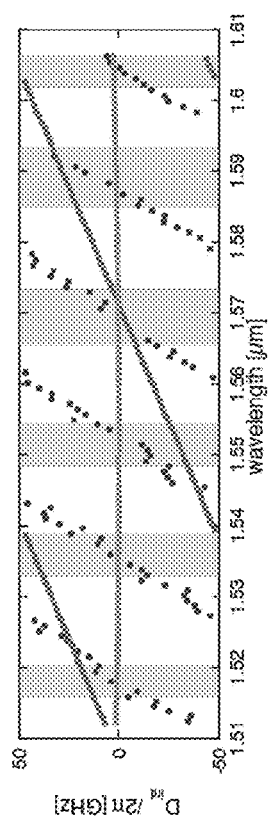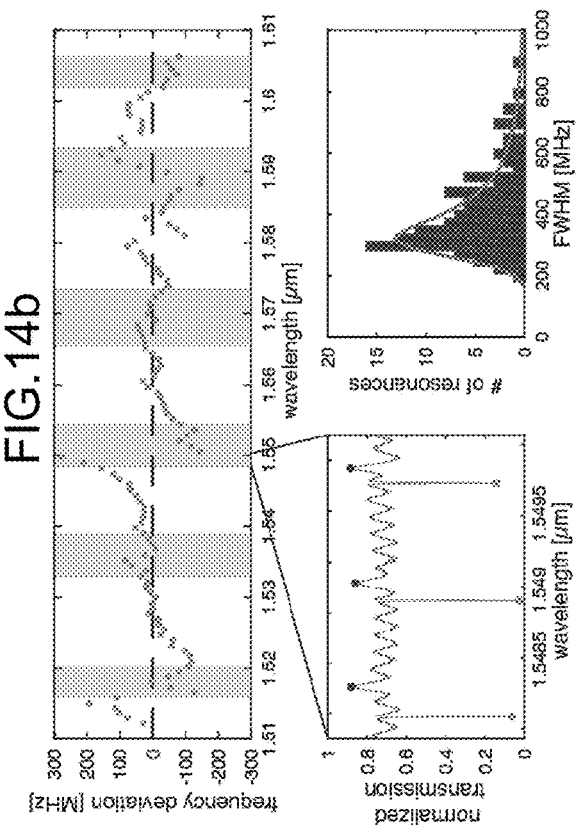

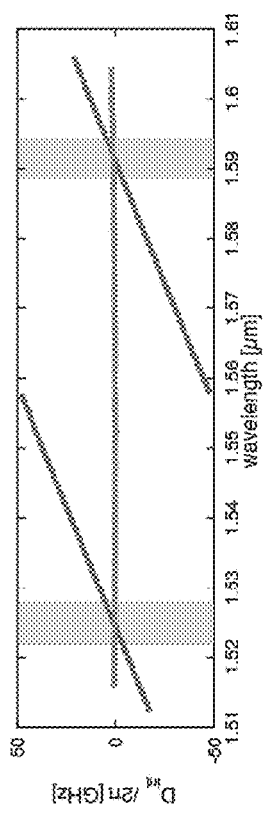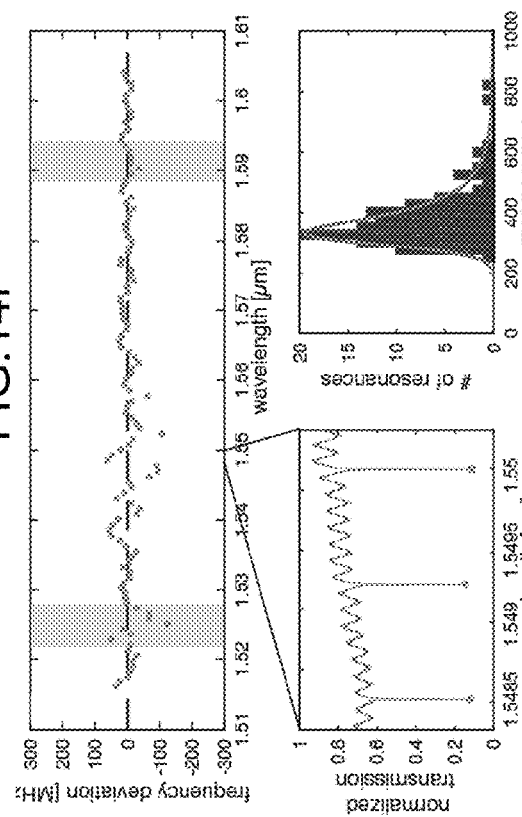

WAVEGUIDE FABRICATION METHOD

CROSS-REFERENCE TO RELATED APPLICATIONS

The present application claims priority to the Provisional application with the Ser. No. 62/156,923 that was filed on May 5, 2015, the entire contents thereof being herewith incorporated by reference. The present application also claims priority to the Provisional application with the Ser. No. 62/253,186 that was filed on Nov. 10, 2015, the entire contents thereof being herewith incorporated by reference.

FIELD OF THE INVENTION

The present invention relates to the field of waveguides and optical devices, and a novel fabrication method for producing such devices, for example a frequency comb generation device.

DISCUSSION OF THE BACKGROUND ART

Low loss, silicon nitride (SiN) based integrated waveguides have for example recently emerged as attractive platform for integrated photonic devices, such as notch filters and frequency comb generators. The combination of the large bandgap and wide transparency range with CMOS compatible fabrication make SiN highly interesting especially for nonlinear optics. Using ring resonators fabricated from high confinement, anomalous dispersion SiN waveguides, broadband frequency comb generation was achieved. However the reliable fabrication of such SiN waveguides with thickness in excess of 0.7 µm remains challenging.

Integrated silicon nitride waveguides and resonator structures are an attractive platform for nonlinear optics. SiN waveguides combine the material's large bandgap and wide transparency range with CMOS compatible fabrication and a large effective nonlinearity. Upon launching a femtosecond laser pulse inside a SiN waveguide the high effective nonlinearity leads to efficient supercontinuum generation. Moreover the fabrication of high-Q SiN microresonators with anomalous group velocity dispersion, has allowed to observe parametric oscillations in integrated SiN microresonators. Planar SiN based microresonators can thus serve as integrated frequency comb generators, via the Kerr frequency comb generation mechanism first reported in 2007.

Following this pioneering work, advances in SiN nonlinear photonics have included in recent years octave spanning frequency comb generation, the observation of phase locked states (via sub-comb synchronization), and recently, the demonstration of dissipative temporal solitons and soliton induced Cherenkov radiation in SiN microresonators. SiN microresonator frequency combs have a high application potential and several promising applications have been demonstrated such as the use of low phase noise SiN comb states in coherent communication with Tb/s datarates and the observation of ultrafast optical waveform generation.

So far integrated waveguides, based on SiN or other materials, are typically fabricated using a subtractive process approach: the waveguide structures are etched into a previously deposited thin film of the waveguide material. Due to the dispersion properties, high confinement waveguides with heights in excess of 0.7 µm are required for efficient nonlinear processes. FIG. 1 shows the problems that arise during the fabrication of such high confinement SiN waveguides. SiN thin films typically exhibit high tensile stress and tend to crack when deposited thicker than 250 nm (FIG. 1a). Such cracks cause high scattering losses in the waveguide and must be avoided. Further the gap between two closely spaced, thick waveguides can present a critical aspect ratio for several processing steps. The dry etch process is typically optimized to produce smooth waveguide sidewalls, to limit scattering losses, but often does not accurately transfer a resist mask pattern for narrow aspect ratios. Due to this etch limitations slanted sidewalls and locally different etch rates are often a problem.

The SiN etch process is a low power etch process optimized for smooth sidewalls, that can however create only aspect ratios of 2:1 (FIG. 1b). During the consequent $SiO_2$ cladding deposition, voids can form in-between closely spaced waveguides due to the limited conformality of the deposition processes (FIG. 1b).

It was also found that silicon oxide layers form between the SiN layers when using multistep deposition with thermal cycling to deposit the SiN thin films (FIG. 1c). The effect of these oxide layers on the optical performance remains unclear.

SUMMARY

It is therefore one aspect of the present disclosure to provide a waveguide fabrication method is provided that overcomes the above challenges. The method preferably includes the steps of providing a substrate including at least one waveguide recess structure and a stress release recess structure for receiving a waveguide material, and depositing the waveguide material onto the substrate and into both the at least one waveguide recess structure and the stress release recess structure.

According to another aspect of the present disclosure, the method further including the step of carrying out planarization of the deposited waveguide material.

According to still another aspect of the present disclosure, the method further including the step of depositing a cladding layer onto the planarized waveguide material.

According to yet another aspect of the present disclosure, the stress release recess structure includes a plurality of indentations formed in the substrate.

According to still another aspect of the present disclosure, the stress release recess structure encloses the at least one waveguide recess structure.

According to yet another aspect of the present disclosure, the substrate further includes a recess-free zone between the stress release recess structure and the substrate waveguide recess structure.

In some embodiments, the plurality of indentations are regularly or irregularly spaced one from the other on the substrate.

In some embodiments, the plurality of indentations form at least one repeating pattern of indentations across the substrate.

In one embodiment, the plurality of indentations form a checkerboard structure or layout across the substrate.

According to yet another aspect of the present disclosure, a height of the waveguide material deposited in the at least one waveguide recess structure after planarization is between 600 nm and 1.5 µm to permit anomalous dispersion at wavelengths longer than 1 µm.

In one embodiment, the at least one waveguide recess structure is tapered.

It is yet another aspect of the present disclosure to provide a device including the at least one waveguide produced according to the waveguide fabrication method.

According to still another aspect of the present disclosure, the method further includes the step of providing a hard mask layer including at least one waveguide recess structure and a stress release recess structure and forming the at least one waveguide recess structure and the stress release recess structure in the substrate using said hard mask layer.

The above and other objects, features and advantages of the present invention and the manner of realizing them will become more apparent, and the invention itself will best be understood from a study of the following description with reference to the attached drawings showing some preferred embodiments of the invention.

BRIEF DESCRIPTION OF THE SEVERAL VIEWS OF THE DRAWINGS

FIG. 7a shows a Kerr frequency comb generation inside a 95.7 GHz resonator pumped with a 6 W laser at 192.9 THz, the outer line is a fit of the smooth spectral envelope with a $sech^2$ function;

FIG. 7b inset in FIG. 7a shows a schema of an exemplary device layout produced by the photonic Damascene process that comprises a 100 μm long tapered single mode waveguide section for higher order mode suppression;

FIG. 7c shows the steps observed in the generated light of the tapered device while scanning through the resonance during frequency comb generation;

FIG. 10a shows is a scanning electron microscopy (SEM) images of a dispersion optimized 240 μm SiN micro-ring resonator;

FIG. 10b shows a magnified image of the mode filtering section with an adiabatic tapered section (length 130 μm);

FIGS. 10c and 10d respectively show cross sections of the ring resonator's waveguide (dimensions 0.8×1.65 μm), and the taper waist (dimensions 0.8×0.6 μm);

FIGS. 14a to 14h shows results of the characterization of resonators, where FIGS. 14a to 14d concern the characterization of a resonator with constant waveguide width and are compared to a resonator including the mode filtering section with $w_t=0.45$ μm (FIGS. 14e to 14h); FIG. 14a shows integrated dispersion $D_{int}$ as a function of wavelength of two fundamental modes and one higher order mode families, with $\tilde{D}_1=D_{1,TM_{00}}\approx2\pi\times96$ GHz; FIG. 14b shows a dispersion deviation of the fundamental TM mode (defined as the deviation of $D_{int}$ from a parabolic profile, i.e. $D_{int}-\frac{1}{2}D\mu^2$); FIG. 14c shows a microresonator transmission trace around one wavelength; FIG. 14d shows a distribution of the resonance linewidth over the measurement wavelength range, which is fitted by the Burr distribution; FIG. 14e to FIG. 14h show the corresponding data to that of FIG. 14a to FIG. 14d for a resonator with filter section;

FIG. 9a and FIG. 9b;

Herein, identical reference numerals are used, where possible, to designate identical elements that are common to the figures.

DETAILED DESCRIPTION OF THE SEVERAL EMBODIMENTS

Figure 1:
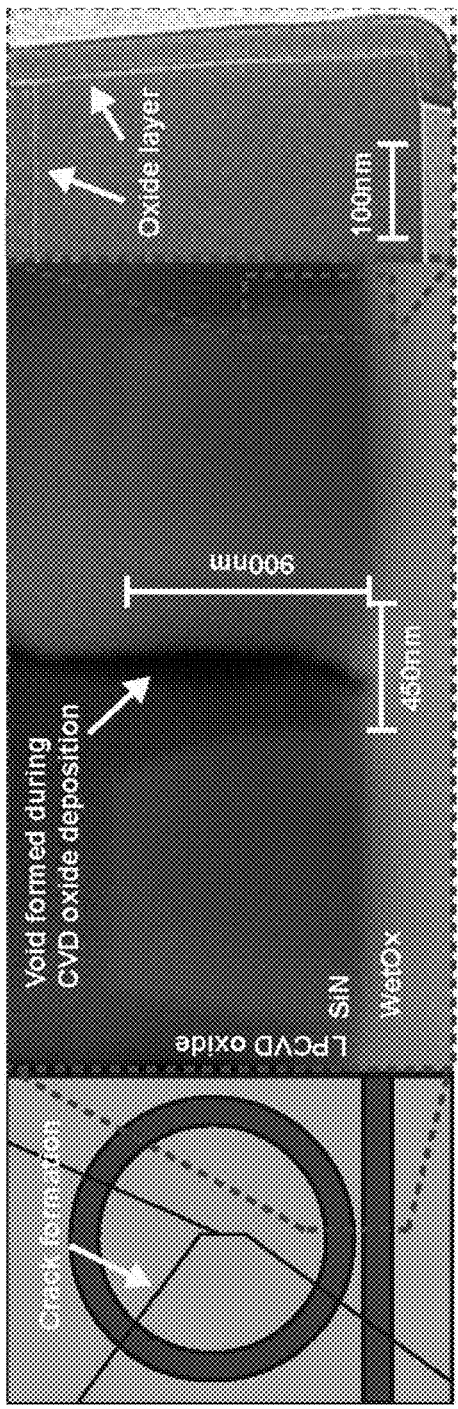
FIG. 1a shows a typical problem with the fabrication of micro resonator devices and is a schematic top view of micro resonator waveguides with cracks formed in the highly stressed SiN film and propagating through the surrounding oxide cladding.
FIG. 1b is an image of cleaved waveguide cross section showing the limited aspect ratio between adjacent waveguides and void formation of the low temperature oxide cladding.
FIG. 1c is a transmission electron microscope (TEM) image showing thin oxide layers formed during thermal cycling deposition of SiN.
Figure 2:
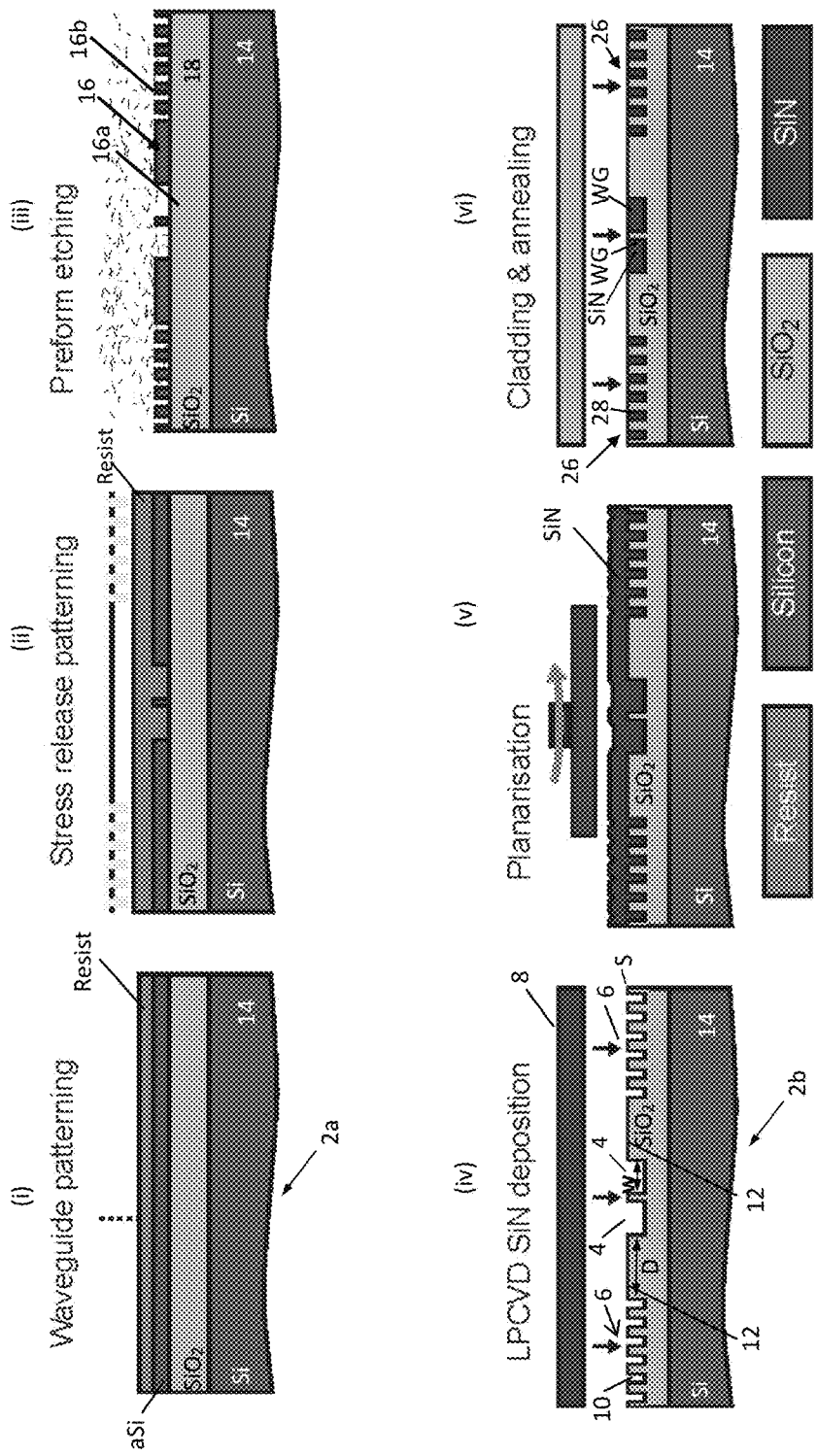
FIG. 2 shows a schematic of steps of the waveguide fabrication method or photonic Damascene process according to an aspect of the present invention.

FIG. 2 shows one aspect of the present disclosure, depicting a waveguide fabrication method or photonic Damascene process for producing at least one waveguide or optical device. This waveguide fabrication method comprises providing a substrate 2b including at least one waveguide recess structure 4 and a stress release recess structure 6 for receiving a waveguide material 8.

The at least one waveguide recess structure 4 may define a substantially straight waveguide core extending across the substrate or resulting device or extending in the form of a spiral. The at least one waveguide recess structure 4 may define a resonator core, that is, a closed loop waveguide core for propagating electromagnetic energy repeatedly through the loop. The substrate 2b may alternatively include a first waveguide recess structure 4 defining a resonator core and a second waveguide recess structure 4 defining a coupling or bus waveguide core for inputting electromagnetic energy to the resonator core and receiving electromagnetic energy outputted from the resonator core (see FIG. 3 and FIG. 7b).

The waveguide recess structure 4 may have a substantially uniform width W or may be tapered along a section of the waveguide (FIG. 7b). The waveguide material 8 is deposited onto the substrate 2b and into both the at least one waveguide recess structure 4 and the stress release recess structure 6 (see for example (iv) of FIG. 2).

Planarization of the deposited waveguide material 8 is then carried out. Planarization of the deposited waveguide material 8 can be carried out using combined mechanical planarization and chemical planarization. The height h of the waveguide material 8 deposited in the waveguide recess structure 4 after planarization is, for example, between 600 nm and 1.5 μm to permit anomalous dispersion at wavelengths longer than 1 μm. These dimensions are preferably for nonlinear optics applications. Lower heights can be used for linear optics applications.

Thermal energy may be applied to the substrate 2b before deposition of the waveguide material 8 to heat the substrate 2b and to permit reflow of an exposed surface of the waveguide recess structure. This permits to lower optical losses of the waveguide. The thermal energy is applied, for example, by placing the substrate 2b in a furnace or oven or by application of laser energy to the exposed surface of the waveguide recess structure 4. The waveguide recess structure 4 and the stress release recess structure 4 of the substrate 2b can be, for example, formed in Silicon dioxide (SiO$_2$) and the thermal energy is applied to the exposed silicon dioxide to carry out an oxide reflow.

The stress release recess structure 6 includes or defines, for example, a plurality of indentations 10 formed in the substrate 2b. The depth of the indentations 10 of the plurality of indentations of the stress release recess structure 6 measured from an outer surface S of the substrate (see for example (iv) of FIG. 2) is substantially equal to or greater than the depth of the waveguide recess structure 4 measured from the outer surface S of the substrate.

The stress release recess structure 6 may enclose the waveguide recess structure 4 as illustrated in FIG. 2 and in FIG. 3. The substrate 2b can further include a recess-free zone 12 between the stress release recess structure 6 and the waveguide recess structure 4. The recess-free zone 12 separates, for example, the stress release recess structure 6 and the waveguide recess structure by a distance D where 50 μm>D>2 μm.

The waveguide recess structure 4 and the stress release recess structure 6 are preferably located in the same plane. The stress release recess structure 6 preferably extends over the entire area of the substrate. The plurality of indentations 10 can be regularly or irregularly spaced one from the other on the substrate. The plurality of indentations 10 form at least one repeating pattern of indentations across the substrate 2b. The plurality of indentations form, for example, a checkerboard structure or layout across the substrate 2b. However, other structures or layouts can also be formed. For example, the structures or layouts illustrated in FIGS. 17a to 17d. The waveguide material 8 can be, for example, Silicon nitride or Aluminum Nitride (AlN). The waveguide recess structure 4 and the stress release recess structure 6 of the substrate 2b are preferably formed in Silicon dioxide (SiO$_2$). The substrate 2b can preferably include a substrate layer 14 comprising silicon, MgF$_2$ or CaF$_2$.

The fabrication method can further include the deposition of a cladding layer onto the planarized waveguide material 8 (see for example (vi) of FIG. 2) to form a waveguide. The cladding layer comprises or can be formed of, for example, Silicon dioxide.

The waveguide recess structure 4 and the stress release recess structure 6 in the substrate 2b may be formed using a hard mask layer 16. The hard mask layer 16 includes at least one waveguide recess structure 16a and a stress release recess structure 16b. The hard mask layer may comprise amorphous silicon (aSi).

FIG. 2 is an exemplary process flow of a fabrication method according to one aspect of the present invention. Waveguide patterning using, for example, electron beam lithography and transfer into the amorphous silicon hardmask 16 is carried out (i). Stress release (for example, checkerboard) structure patterning using, for example, photolithography is carried out (ii). A wet oxide cladding layer 18 is dry etched (iii). Deposition of waveguide material 8, for example LPCVD silicon nitride deposition, on the pre-structured substrate 2b is carried out (iv). This is followed by planarization using chemical/mechanical planarization and ion beam etching (v). Cladding deposition, for example silicon dioxide cladding, and annealing is then performed (vi).

A more detailed description of one example of the waveguide fabrication method is now described. The described waveguide fabrication method is carried out for the fabrication of a SiN resonator, however, the present invention is not limited to resonators of such material.

A four inch (100 mm) silicon wafer with a 4 µm thick wet thermal oxide (available from Silicon Valley Microelectronics) is used as a substrate 2a. A 0.3 µm thick hardmask layer of amorphous silicon (aSi) is then deposited using low pressure chemical vapour deposition (LPCVD). This is to avoid geometry limitations due to etch selectivity and surface roughness induced by resist erosion during the following dry etch into the substrate's oxide film. The waveguide patterns are defined using electron beam lithography into 0.3 µm thick resist coating (Zeon ZEP520A 100%). The resist exposed to the electron beam is removed. For example, development is performed by a bath in nAmyl acetate and a subsequent rinse in isopropanol or a mixture of MIBK/isopropanol. The waveguide patterns are then transferred into the aSi hardmask or layer using a high resolution silicon dry etch (based on $SF_6$ and $C_4F_8$) and subsequently the resist mask is stripped (see (i) of FIG. 2).

Next, dense checkerboard structures, for example, for stress release during the later SiN deposition are defined using photolithography applied to a newly deposited resist layer (resist 5 µm MicroChemicals AZ9260). The exposed resist is removed by a development step. Using the same etch process as previously used for the waveguide pattern, the checkerboard pattern is transferred into the hardmask layer (see (ii) of FIG. 2).

After stripping the organic resist, the patterned aSi layer acts as a mask during the cladding material silicon dioxide ($SiO_2$) etch step ((see (iii) of FIG. 2)). This dry etch ($CHF_3$ and He) yields vertical sidewalls with low roughness and has a selectivity of 10:1 to the aSi hardmask.

After the $SiO_2$ etch, the latter is stripped by a 5 minute bath in 40% potassium hydroxide (KOH) which does not attack the oxide preform pattern. That is, the remaining aSi hardmask is selectively removed by the KOH bath.

A SiN thin film is then deposited via LPCVD from dichlorosilane and ammonia gas precursors at 770° C. in a single deposition run up to the desired thicknesses (see (iv) of FIG. 2). The LPCVD process exhibits excellent uniformity and crack formation is efficiently inhibited through the dense checkerboard structure.

Chemical-mechanical planarization is used to remove most of the excess SiN film and to planarize the top surface (see (v) of FIG. 2). For example, a slurry comprising colloidal silica particles in an aqueous suspension can be used. The slurry can have a pH of 2 and be acidic and based on the presence of Cl- ions. When carrying out planarization, the speed during planarization can be defined by the rotational speed of the polishing head and table. In general, polishing occurs at a head speed of 60 rpm and table speed of 65 rpm. However, these speeds can vary and be adjusted during the polishing process, and the exact value of such parameters depend on, for example, the sample type or slurry used.

To accurately control the material removal, the polishing is stopped approximately 150 nm above the thermal oxide film or cladding layer. After cleaning the slurry particles from the wafer using a BHF etch, ion beam etching (Veeco Nexus IBE) is then used to remove the remaining material.

In order to protect the waveguides, a top cladding of for example 3 µm low temperature LPCVD silicon oxide is deposited (see (vi) of FIG. 2). Finally, residual hydrogen present in the SiN and $SiO_2$ thin films after deposition can be removed through annealing in a nitrogen atmosphere at 1200° C. for 24 h.

Should the resulting structure contain a plurality of optical devices, the wafer can then optionally be separated into individual chips or devices by first defining a photoresist mask, etching 250 µm deep into the Si substrate 14 using a Bosch process and removing the remaining substrate with backside grinding.

Figures 3A, 3B, 3C:
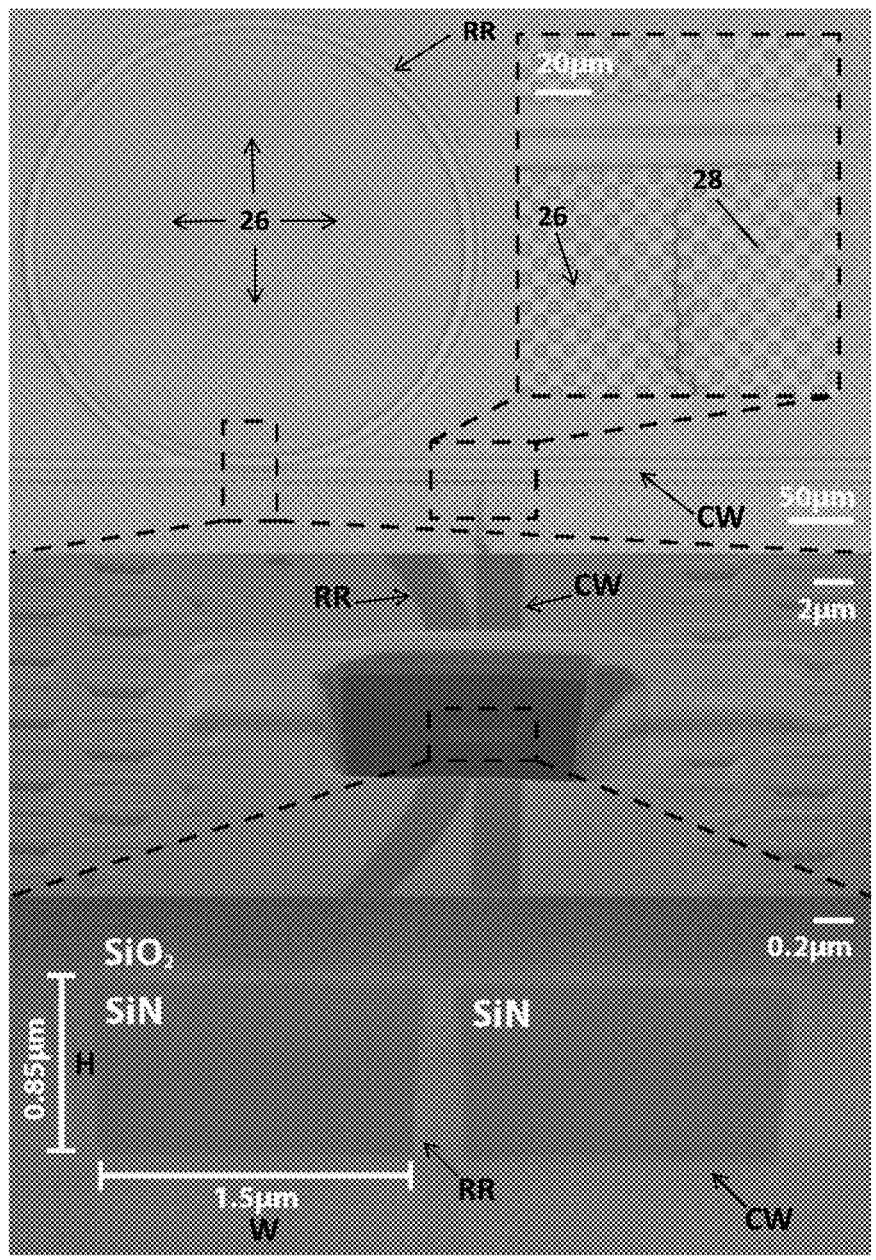
FIG. 3a is an optical image of a micro-resonator device and a waveguide with a surrounding checkerboard structure (rectangle dimensions 5 μm×5 μm) for stress control, as can be seen in the zoomed inset a 10 μm wide area to each side of the waveguide has no checkerboard structure to avoid scattering losses and there are no cracks penetrating the waveguides and the crack shown in the inset is guided by the checkerboard structure and stopped before reaching the waveguide.
FIG. 3b and FIG. 3c show a focused ion beam (FIB) cross-section of a coupling region between the ring micro-resonator and the bus waveguide, the individual SiN waveguides (dark) are found to be 1.5 μm wide and 0.85 μm high with nearly rectangular shape and homogenous filled as can be seen in FIG. 3(c), the coupling region is free of voids and no effect of the waveguide proximity on the waveguide shape is observed.

FIG. 3 shows an optical image of a ring resonator RR and a coupling waveguide CW fabricated with the above described fabrication method or photonic Damascene process, as well as a focused ion beam (FIB) cross sectional image of a coupling region. As further discussed below, the ring resonator waveguide core and the coupling or bus waveguide core are surrounded by a dense checkerboard pattern which ensures high yield fabrication. The FIB cross section (FIGS. 3b to 3c) reveals SiN waveguides with 1.5 µm width W and 0.85 µm height H. The waveguides have nearly or substantially vertical sidewalls due to the high selectivity of the aSi hardmask and the absence of a reflow process. The waveguide top surface is flat, indicating that the planarisation was successful and that no top surface topography was transferred into the waveguide. Dishing effects from the chemical mechanical planarization are not present as the polishing is stopped before reaching the oxide. The deposited SiN uniformity fills the preform and no boundary is observed in the silicon nitride core. One of the advantages of the photonic Damascene process is its ability to produce closely spaced waveguides comprising narrow aspect ratios between them. As seen in FIG. 3c, the aspect ratio of the coupling gap between resonator RR and bus waveguide CW is approximately 4:1 while being free of voids or proximity related effects.

The photonic Damascene process for planar SiN waveguides thus relies on patterning or structuring and/or providing a preform or structured substrate prior to core material deposition and a subsequent planarization step.

It is possible to reliably fabricate, for example, SiN waveguides with arbitrarily large dimensions due to the efficient control of the thin film stress by a novel stress control technique (see below) using a dense checkerboard pattern structure. For the first time, micro-resonators comprising 1.35 µm high SiN waveguides (FIG. 4) with Q factors of $3.7 \times 10^6$ (FIG. 5) have been fabricated.

Crack formation in high stress LPCVD SiN thin films is a long standing problem that has often limited the film thickness to below 250 nm. In order to fabricate waveguides with heights larger than 0.7 µm necessary to achieve anomalous dispersion, and thus efficient nonlinear processes, several techniques like thermal cycling and crack stop structures have been developed. Previous work applying a Damascene process for SiN waveguides used SiN film deposition up to only 0.4 µm maximal thickness to limit crack formation. The crack development in SiN thin films strongly depends on the substrate topography.

The above described photonic Damascene process approach allows the use of substrate topography for stress control in the deposited thin film. The high tensile stress of a thick stochiometric LPCVD SiN core film can be efficiently relaxed through dense prestructuring of the substrate. Using this technique, it is possible to reliably deposit and process silicon nitride films with arbitrary thickness for the realization of large core area waveguides. When depositing thinner films the pre-patterned trench is either not completely filled or the limited planarization ratio of the chemical mechanical polishing transfers the surface morphology partly into the waveguide.

Figure 4:
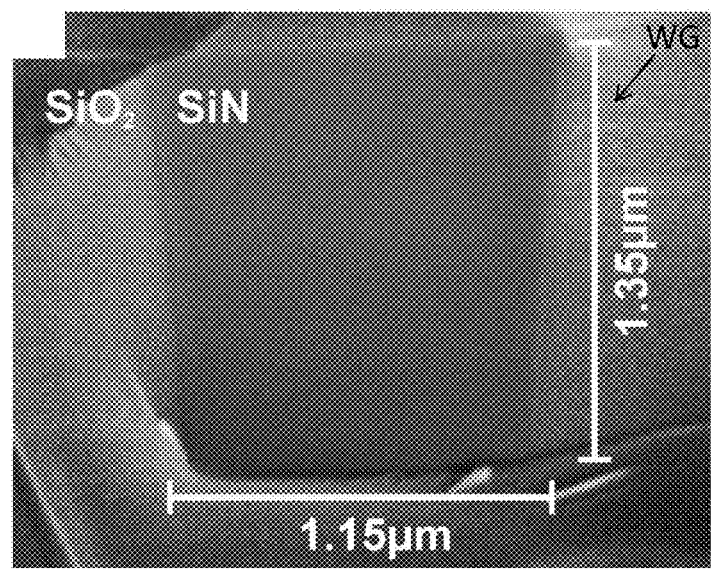
FIG. 4 shows a cleaved cross section through a SiN waveguide (dark) with 1.35 μm height and 1.15 μm width.
Figure 8:
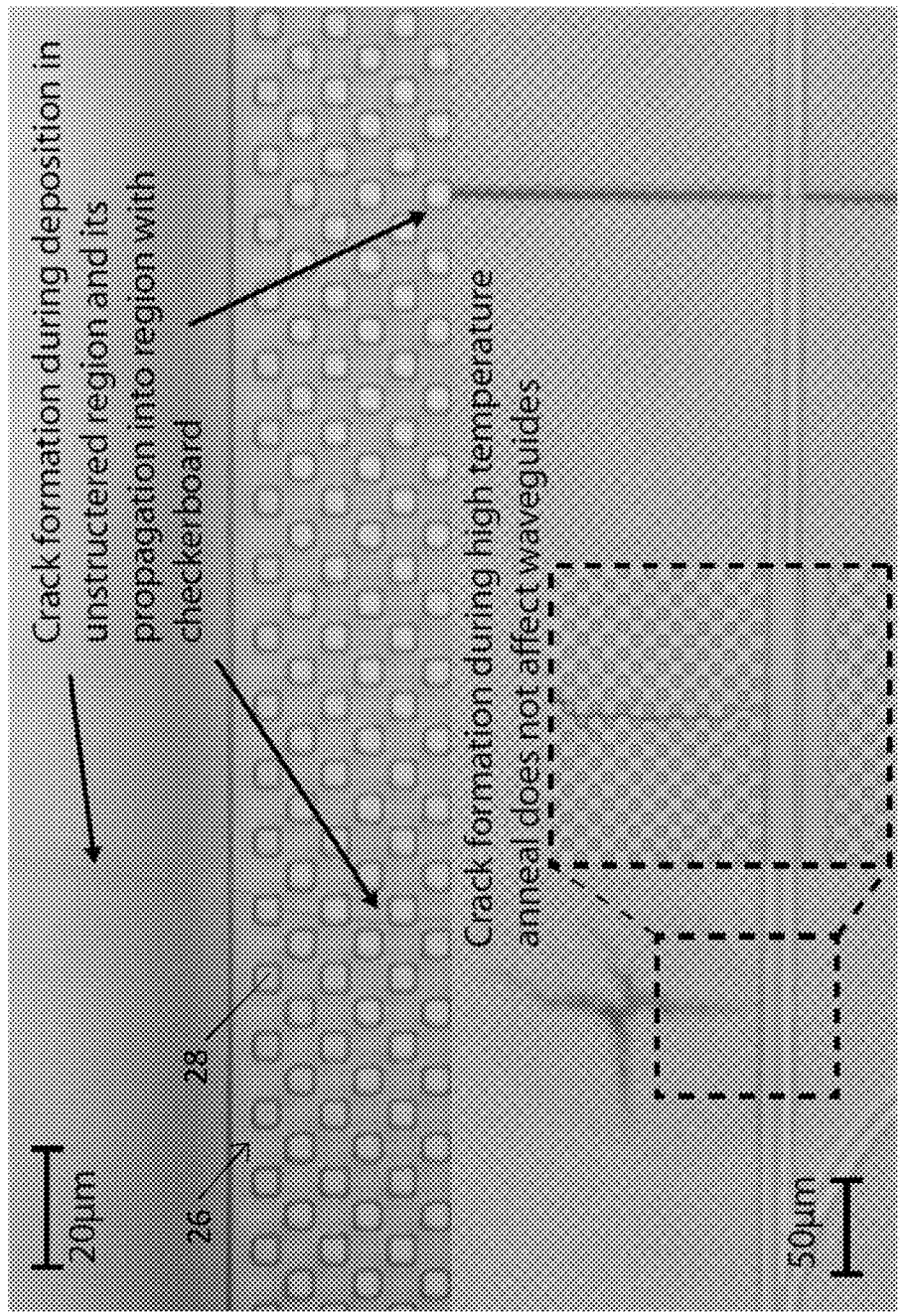
FIG. 8 shows a dense checkerboard pattern surrounding waveguides and inhibiting crack formation and propagation to ensure high device yield.

The dense pre-patterning consists, for example, of introducing a checkerboard structure (exemplary rectangle dimensions are 5 µm×5 µm) around the waveguides (FIG. 3a). The checkerboard covers the full wafer but the waveguides are surrounded for example by a 10 µm wide checkerboard free area to prevent scattering losses. The absence of extensive crack formation in post deposition processing steps indicates that the dense prestructuring efficiently reduces the silicon nitride film stress. Additionally, no wafer bending, due to asymmetric wafer coating with highly stressed thin films, is observed after the high temperature annealing steps. As seen in the inset of FIG. 2a and in FIG. 8, cracks can still occur during the post deposition processing, but do not penetrate the optical waveguide as they are stopped by the pattern-free area around the waveguide. Despite the high mechanical action during chemical-mechanical planarization, more than a 95% sample yield is obtained. Using this stress release technique, the photonic Damascene process is able to fabricate waveguides with thicknesses significantly larger than 1 µm (FIG. 4). The cleaved cross section of FIG. 4 shows a SiN waveguide WG with record thickness of 1.35 µm. Waveguides with such height enable the engineering of broadband anomalous dispersion even at mid infrared wavelengths.

Figure 5:
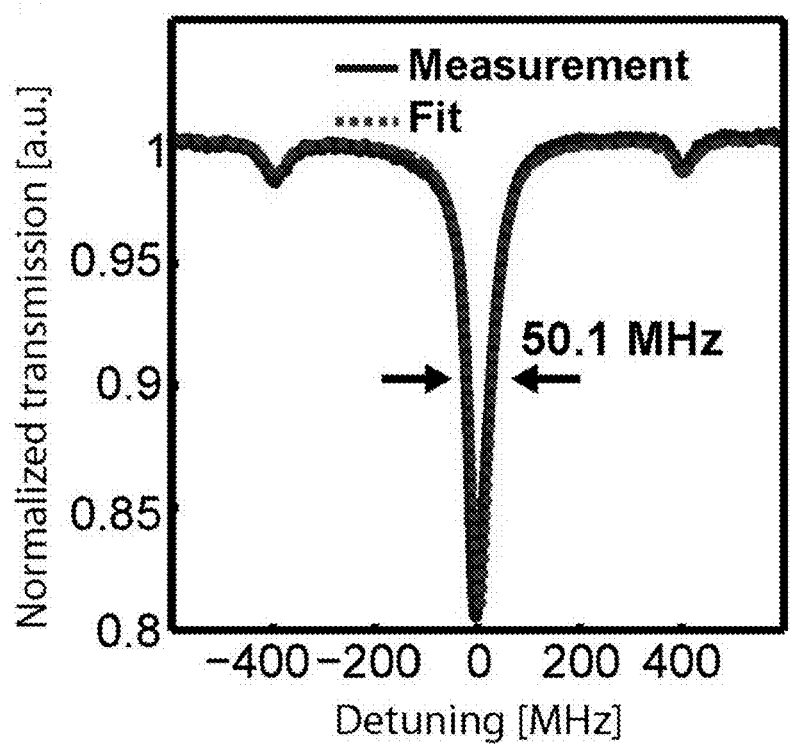
FIG. 5 illustrates a resonance linewidth at 1598.04 nm of a ring resonator with a radius of 238 μm (FSR=100 GHz) built from 1.35 μm high and 1.5 μm wide waveguides, a resonance linewidth of 50.1 MHz is extracted which corresponds to a quality factor of $Q=3.7\times10^6$.

Ring resonator devices fabricated using the waveguide fabrication method or photonic Damascene process were characterized with respect to their losses and mode structure. FIG. 5 shows the linewidth of a resonator mode at 1598.04 nm. The resonator has a radius of 238 µm (FSR=100 GHz) and its waveguide is 1.15 µm wide and 1.35 µm high. The resonance is strongly undercoupled so that the total linewidth $k=k_0+k_{ex}$ is dominated by the internal losses $k_0$ and the coupling loss contribution $k_{ex}$ is negligible. In order to frequency calibrate the laser scan across the resonance, 400 MHz sidebands produced by an electrooptic modulator were used. By fitting the central dip with a Lorentzian, a linewidth of 50.1 MHz is extracted which corresponds to a quality factor of $Q=3.7\times10^6$. Thus, micro-resonators fabricated using the photonic Damascene process achieve similar loss performance to previously published for SiN resonators produced using subtractive processes.

Figure 6A:
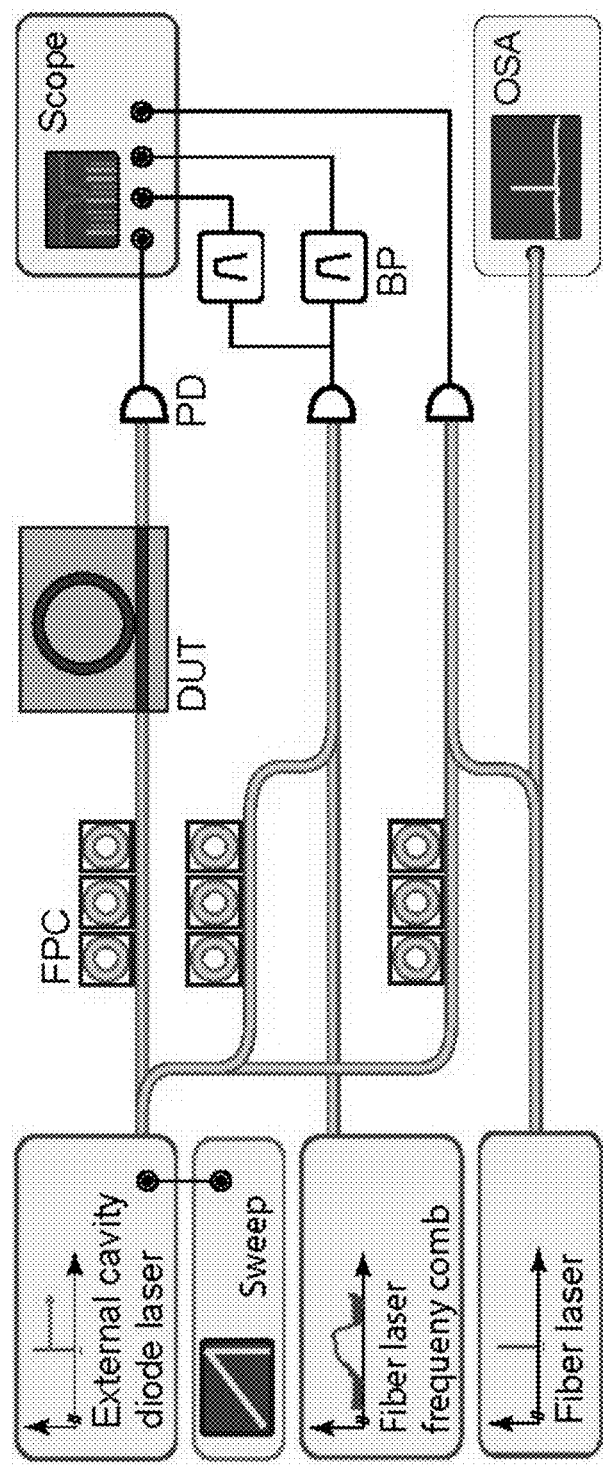
FIG. 6a shows a schematic of a setup used for recording a calibrated transmission trace of a microresonator, the frequency scan of an external cavity diode laser is referenced against a frequency comb and a fiber laser for relative respectively absolute frequency calibration, the device's (DUT) transmission amplitude is recorded with a photodiode (PD) and bandpass filters (BP) transform the beat signal between the scanning laser and frequency comb into calibration marker peaks.

Anomalous dispersion and an undistorted mode structure are essential for the nonlinear performance of integrated micro-resonators. Frequency comb assisted diode laser spectroscopy is used to assess dispersion and the mode spectrum of a resonator with 238.2 µm radius, 1.5 µm waveguide width and 0.85 µm waveguide height (FIG. 3c). FIG. 6a shows schematically the measurement setup used. The light of an external cavity diode laser (EDCL) is coupled into the device (DUT) using lensed fibers. By scanning the laser over 10 THz the device's transmission amplitude is recorded using photodiodes (PD). The frequency calibration of the laser scan is achieved through simultaneously recording the beat signal of the ECDL and the teeth of a fiber laser frequency comb. The beat signal is filtered by two bandpass filters that produce reference markers recorded on the scope. For wavelength calibration the beat signal of the ECDL with a stable, narrow linewidth fiber laser is recorded, the wavelength of which is measured with an optical spectrum analyzer (OSA). The measurement technique can resolve the relative frequency spacing of two resonances with a precision of approximately 10 MHz. Due to the waveguide dispersion, the resonances of the microresonator are not equidistantly spaced, the free spectral range (FSR) slightly changes with frequency. For a certain mode with number µ these changes can be expressed as an integrated deviation $D_{int}$ of the resonance frequency from the grid defined by a central FSR:

$$D_{int}(\mu)=\omega_\mu-(\omega_0+D_1\mu)=(1/2)D_2\mu^2+(1/6)D_3\mu^3+\ldots,$$

where µ is the relative mode number counted from the central mode µ=0, $D_1$ is the FSR of the central mode, and $D_2$ and $D_3$ are the second and third order dispersion coefficients.

Figures 6B, 6C:
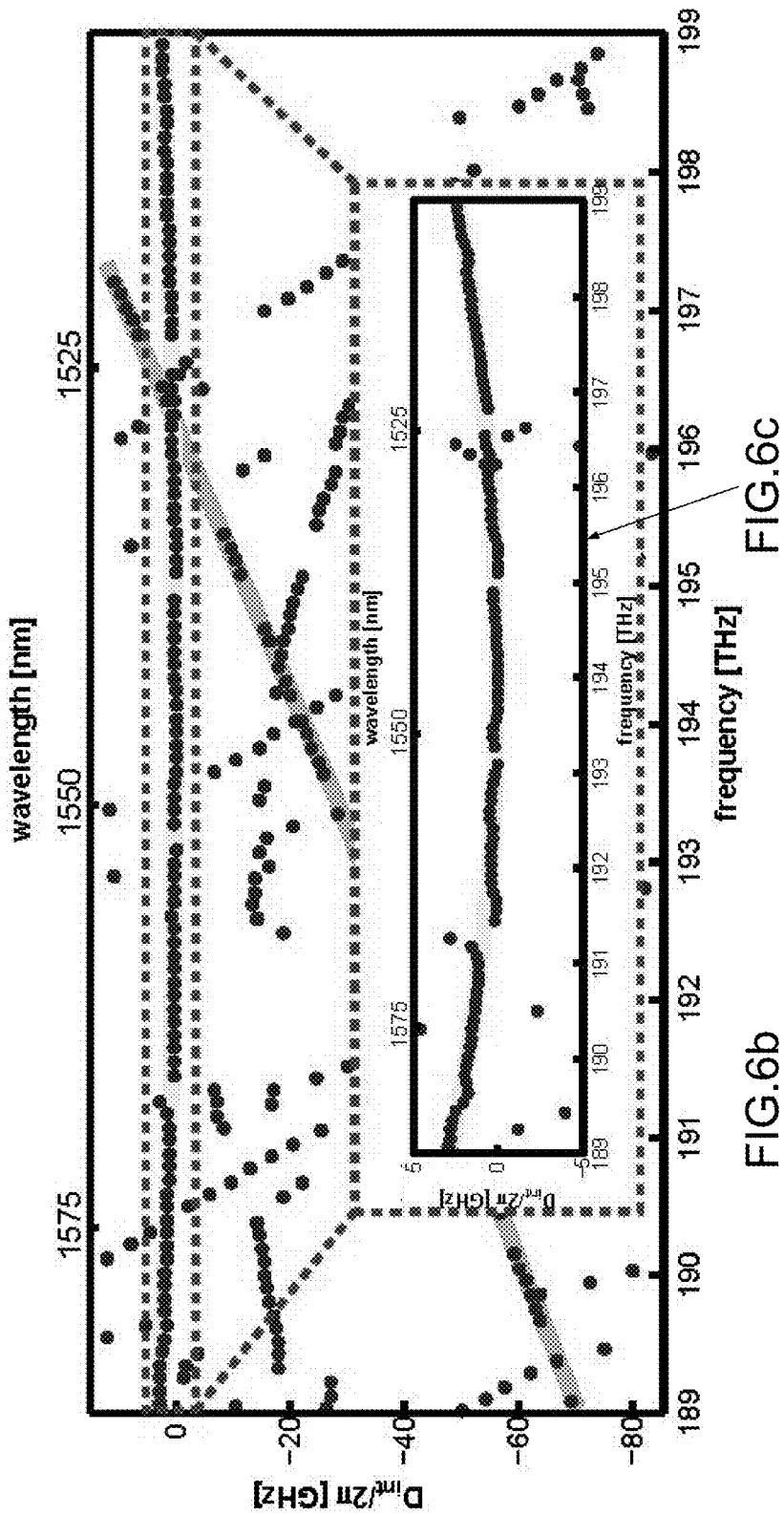
FIG. 6b presents the mode structure of a microresonator with 238.2 μm radius, 1.75 μm waveguide width and 0.85 μm waveguide height, the plot shows the deviation of each detected mode from a free spectral range of 95.65 GHz, the $E_{x11}$ mode family is underlayed in and the $E_{y11}$ mode family.
FIG. 6c is a magnified view of the local parabolic dispersion of the $E_{y11}$ mode family, the underlayed parabola is fitted to the detected resonances and a value of $D_2=0.49$ MHz is extracted.

FIG. 6b shows an Echelle plot representation of the device's resonant mode spectrum. The plot shows every identified resonance in the transmission trace as one point and plots their individual deviation from a central FSR of 95.65 GHz. Resonances belonging to the same mode family are lined up, showing different slopes depending on their individual free spectral range. By comparing with finite element simulations (Comsol Multiphysics) of the resonator's mode spectrum, the fundamental mode families can be identified. Resonances belonging to the $E_{x11}$ are underlayed in continuous gray (increasing from left to right) while the $E_{y11}$ family is underlayed in lighter gray (substantially horizontal in the dashed box). Modes belonging to the higher order mode families are only partly detected and cannot be clearly identified due to their very similar FSRs. FIG. 6c, inserted in FIG. 6b, shows the parabolic deviation of the $E_{y11}$ mode family from the central FSR of 95.65 GHz. By fitting with a polynomial, the local dispersion of $D_2=0.49$ MHz is extracted. This dispersion value is in good agreement with the value of $D_2=0.26$ MHz extracted from simulations. Moreover, avoided modal crossings of the $E_{y11}$ mode family with the $E_{x11}$ family as well as higher order mode families are observed.

The nonlinear performance of resonators fabricated using the photonic Damascene process was measured. FIG. 7a shows the broadband optical frequency comb generated upon tuning a 6 W laser into a resonance of a 95.7 GHz resonator. The resonator has a radius of 238 µm, waveguide width of 1.5 µm and height of 0.8 µm. The resonator includes a 100 µm long, tapered single mode waveguide section or optical mode filtering device 22 (FIG. 7b). Within this section 22 the waveguide tapers down to only 0.5 µm width and 0.7 µm height in order to allow only propagation of the fundamental mode families. The device showed nearly critically coupled resonances with linewidths of around 150 MHz. The single mode waveguide section 22 efficiently suppressed resonances and modal crossings due to higher order mode families while not deteriorating the device's quality factor. Upon frequency scanning the pump laser from shorter to longer wavelengths across the resonance, the light transmitted through the device is monitored as well as the generated comb light including all teeth except the central pump line. Distinct steps in the transmitted light as well as the generated light power (FIG. 7c) were observed. Previously such steps have been identified to be a characteristic sign for soliton formation inside a microresonator. By tuning the pump laser inside the last step of the cascade a frequency comb with smooth spectral envelope was generated (FIG. 7a). The frequency comb has a smooth spectral shaped envelope, characteristic for single soliton propagation inside the resonator. By fitting with a $sech^2$ envelope function, a 3 dB bandwidth of 6.6 THz is extracted. This corresponds to a soliton pulse duration of 47.7 fs. Furthermore, an offset between the pump line at 192.9 THz and the maximum of the hyperbolic secant's maximum can be seen.

It should be noted that different cladding materials other than silicon dioxide may be used in order to extend the spectral range of the waveguide, in terms of their absorption and dispersion properties. Only the process of structuring the cladding/substrate needs to be adapted for the alternative cladding material, to include a suitable (hard-)mask and etch process. The following steps of deposition and planarization remain unchanged. Alternatively, it is possible to structure a Silicon substrate. A SiO$_2$ cladding can then be formed by subsequent oxidation of the Si material.

The above described the SiN core material is deposited using low pressure chemical vapor deposition. This process step can be alternatively be carried out (as for different materials) using a different type of SiN deposition process, like e.g. plasma enhanced chemical vapor deposition (PECVD).

In order to remove roughness in the structured waveguide pattern induced by e.g. the etch process, a thermal reflow can be applied to the preform. The substrate is either heated in a furnace or locally by e.g. a laser close to its melting point to enable its deformation by surface tension forces. In this way the surface organizes itself to be smooth and present roughness is significantly reduced.

Residual hydrogen present in the SiN core material as well as the deposited cladding material cause optical absorption losses. These can be reduced by applying an annealing step after their deposition. This annealing step can consist of simple furnace heating in controlled atmosphere to temperatures above 1000 C. However, different methods can be used, for example, annealing in chlorine atmosphere, as done for optical fibers, to drive out hydroxyl groups, or annealing using a strong UV light, that breaks the hydrogen bonds.

Apart from the above described chemical mechanical planarization, which involves the polishing of the surface using mechanical and chemical impact, other alternative methods can be used for planarization. For example, the so called resist etch back technique which involves coating a resist layer on the unplanarized surface which forms a flat surface due to the liquid nature of the resist. Then, a suitable etch process is used to remove resist and the material to be planarized with the same speed (selectivity 1:1), the flat resist top surface can be transferred into the target material.

Another aspect of the present invention relates to a waveguide device or resonator device including at least one waveguide produced according to the above described fabrication method as well as a stress release structure or pattern 26 produced according to the above described fabrication method. The stress release structure or pattern 26 includes the stress release recess structure 6 filled with the filler material 8 and enclosing the at least one waveguide or waveguide recess structure 4.

Yet another aspect of the present invention concerns an optical device including the waveguide device and the resonator device each including at least one waveguide produced according to the above described fabrication method as well as a stress release structure or pattern 26 produced according to the above described fabrication method. The stress release structure or pattern 26 includes the stress release recess structure 6 filled with the filler material 8 and encloses the waveguides of the waveguide device and the resonator device.

In the above waveguide device, resonator device or optical device, a height of the waveguide material 8 deposited or present in the waveguide recess structure 4 after planarization is between 600 nm and 1.5 μm to permit anomalous dispersion at wavelengths longer than 1 μm. These dimensions are preferably for nonlinear optics applications. Lower heights can be used for linear optics applications.

The waveguide of the waveguide device or optical device extends substantially straight across the device or extends in the form of a spiral. The waveguide of the resonator device or optical device extends across the substrate or device to form a closed loop or ring.

The waveguide and the stress release structure 26 can be located in the same plane. The separation zone 12 can be present between the stress release structure 26 and the waveguide. The separation zone can separate the stress release structure and the waveguide by a distance D where 50 μm<D<2 μm.

The stress release structure 26 includes the plurality of indentations 10 formed in a first layer comprising a first material and the indentations are filled by a second material different to the first material. A depth or height of the indentations 10 is substantially equal to or greater than a depth or height H of the waveguide. The plurality of indentations 10 can be regularly or irregularly spaced one from the other across the first layer. The plurality of indentations 10 can form at least one repeating pattern of indentations across the first layer. Preferably, the plurality of indentations form a checkerboard structure or layout across the layer. However, other structures or layouts can also be formed. For example, the structures or layouts illustrated in FIGS. 17a to 17d. The checkerboard structure can include tiles 28 that are regularly or irregularly spaced. The tiles 28 can be rectangular in cross-sectional shape, for example, 5 μm×5 μm, but also be of a non-rectangular shape, for example, circular or hexagonal. The plurality of indentations 10 can extend over the entire first layer.

The second material can be, for example, Silicon nitride (SiN) or Aluminum Nitride (AlN) or diamond and the first material can be, for example, Silicon dioxide (SiO$_2$). The waveguide device, resonator device or optical device can include a substrate layer comprising silicon, MgF$_2$ or CaF$_2$. The waveguide includes smoothed waveguide walls formed by an oxide reflow to reduce the optical losses of the waveguide.

The waveguide fabrication method or photonic Damascene process has demonstrated for silicon nitride based nonlinear, photonic devices, the fabrication of waveguide structures with so far unattainable dimensions and aspect ratios. For the first time it has been shown that a pre-structured substrate with the waveguide layout as well as a stress relieve pattern enables the reliable deposition and processing of thick, high stress SiN thin films. Q factors of $3.7 \times 10^6$ were achieved in resonators comprising 1.35 μm high and 1.5 μm wide waveguides. Anomalous dispersion is achieved as well as broadband frequency comb generation with a 3 dB bandwidth of 6.6 THz. The method can permit low power, nonlinear photonics based on planar integrated waveguides to be produced even in the mid infrared spectral region. Furthermore, the photonic Damascene process permits to directly yield samples with planar surfaces ready for integration with opto-electronic 2D materials, like graphene or MoS$_2$ or to produce, for example multilayer, photonic circuits, or flip chip bonding integration with III-V semiconductors.

A reliable fabrication method for low loss, high confinement optical waveguides is thus provided. Microresonators based on large SiN waveguides enable frequency comb generation in the mid infrared spectral region. Additionally other photonic platforms based on materials like AlN or diamond from the absence of material specific etch processes. Moreover the polished waveguide surfaces are attractive for multilayer photonic circuits or integration with flip chip bondable photonic building blocks.

Yet another aspect of the present invention concerns an optical device 30 including a tapered resonator TR (FIG. 9a) or an optical device 32 including a tapered resonator TR and a coupling waveguide CW (FIG. 9b) for inputting electromagnetic energy to the tapered resonator and receiving electromagnetic energy outputted from the tapered resonator. Such an optical device may be produced for example using the above described fabrication method or may alternatively be produced for example using a subtractive process as will be described further below in relation to FIG. 16.

The optical device 30 including the tapered resonator may comprise at least one waveguide produced according to the above described fabrication method as well as a stress release structure or pattern 26 produced according to the above described fabrication method. The stress release structure or pattern 26 includes the stress release recess structure 6 filled with the filler material 8 and encloses the waveguide of the tapered resonator.

The optical device 32 including the tapered resonator TR and the coupling waveguide CW may each comprise at least one waveguide produced according to the above described fabrication method as well as a stress release structure or pattern 26 produced according to the above described fabrication method (FIGS. 10a and 10b). The stress release structure or pattern 26 includes the stress release recess structure 6 filled with the filler material 8 and encloses the waveguide of the tapered resonator and encloses the waveguide of the coupling waveguide. The tapered resonator TR of the optical devices 30, 32 comprises a waveguide for high order mode suppression.

High-Q silicon nitride (SiN) microresonators enable optical Kerr frequency comb generation on a photonic chip and have recently been shown to support fully coherent combs based on temporal dissipative Kerr soliton formation. For bright soliton formation it is necessary to operate SiN waveguides in the multimode regime so as to produce anomalous group velocity dispersion. This can lead to local disturbances of the dispersion due to avoided crossings caused by coupling between different mode families, and therefore prevent the soliton formation. The optical devices 30, 32 include a single mode filtering section 34 inside a high-Q resonator enabling to efficiently suppress avoided crossings, while preserving high quality factors ($Q \sim 10^6$). The device allows single soliton formation in the resonator with the filtering section.

Silicon nitride (SiN) integrated waveguides are an ideal platform for on-chip nonlinear optics, which advance diverse research topics such as supercontinuum generation and microresonator Kerr frequency comb generation. The latter represents a technology that enables an optical frequency comb with the mode spacing in the microwave range and with large bandwidth reaching one octave. Applications of low phase noise comb states in SiN microresonators so far include coherent communication as well as arbitrary waveform generation. Recently, the demonstration of dissipative Kerr soliton formation in microresonators, in crystalline resonators, photonic chip-based SiN microresonators and in monolithic silica micro-disks, further provides a reliable and novel method for the generation of fully coherent and broadband frequency combs with smooth spectral envelope, and the generation of ultrafast and ultrashort femtosecond pulses.

This enables novel applications such as low-noise microwave generation, coherent data transmission and ultrafast spectroscopy. In addition, it has been shown that the spectral bandwidth can be substantially increased into the normal dispersion regime using soliton induced Cherenkov radiation.

However, it was observed that locally altered dispersion can prevent the soliton formation through the interaction between different mode families supported by the resonator. For certain frequencies two modes belonging to different families can be almost resonant and thus a minute coupling between both, e.g. through waveguide imperfections, can result in the formation of hybrid modes with shifted resonance frequencies. This results in a local defect in the resonator dispersion, which is termed "avoided modal crossing".

While detrimental for dissipative Kerr soliton formation, such an avoided modal crossing can provide local anomalous group dispersion (GVD) in microresonators such that it also initiates generation of Kerr frequency combs in an otherwise normal GVD regime. Dual-ring geometries were also used to induce controllable avoided modal crossing between microresonators (in normal GVD regime) and to generate frequency combs with adjustable free spectral ranges (FSRs).

The optical devices 30, 32 address the above mentioned problem and permit to suppress higher order mode families in the resonator by introducing a mode filtering section or device 34 into this microresonator. By inserting an adiabatic transition to a single mode waveguide inside the resonator, avoided crossings in the resonator can be strongly reduced, while preserving the anomalous GVD as well as the high quality factor ($Q \sim 10^6$) of the fundamental modes. With this novel resonator design, the generation of broadband frequency combs based on single dissipative Kerr soliton formation are possible.

The novel design of the mode filtering section 34 in the SiN microresonator is realized by tapering down the multimode loop or ring waveguide to single mode (see FIGS. 9 and 10). Preferably, the design is a trade-off between two criteria, namely on the one hand, the filtering section 34 is sufficiently long and the waist (width W) sufficiently small such that higher order mode families are cut-off; and on the other hand, the taper length has to be sufficiently short, to preserve an overall resonator dispersion that still yields anomalous GVD in order to allow for dissipative Kerr soliton formation and frequency comb generation via four-wave-mixing processes. The boundary of the tapered waveguide region is defined as:

$$w(\varphi) = \frac{w_n + w_t}{2} - \frac{w_n - w_t}{2} \cos\left(\pi \left(\frac{2r\varphi}{l_t}\right)^3\right) \quad (1)$$

where $l_t$ is the taper length, r is the resonator radius, $w_n$ is the nominal width of the multimode waveguide, $w_t$ is the minimal width at the taper waist.

$$r \cdot \varphi \in \left[-\frac{l_t}{2}, \frac{l_t}{2}\right]$$

where $\varphi$ is the angular coordinate and $\varphi=0$ indicating the position of the taper waist.

Figure 12:
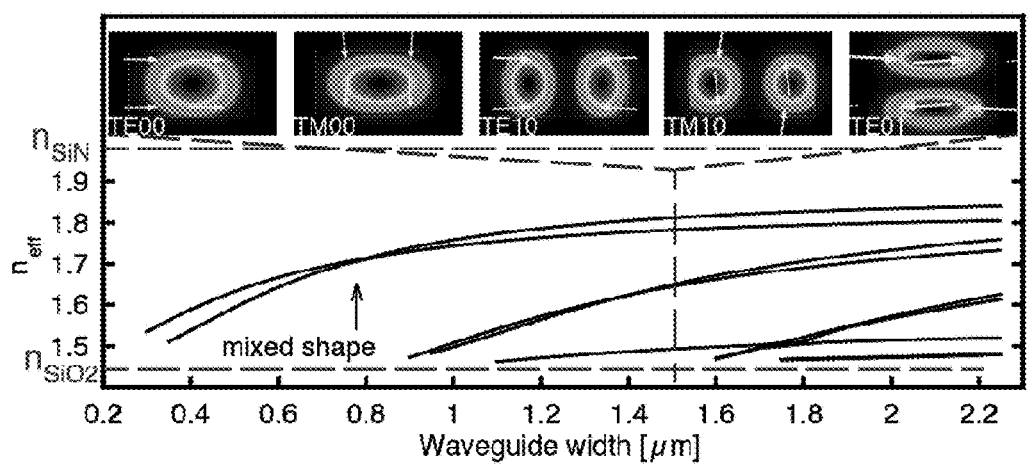
FIG. 12 shows the effective refractive index as a function of the waveguide width for the full set of mode families, at the free space wavelength $\lambda_0=1.55$ μm; the mode profiles including the electric field vectors are shown as insets for the width of 1.5 μm; the waveguide height is 0.8 μm and the resonator's FSR is 100 GHz where an example region of mixed-shape mode profiles is indicated.

In order to reveal the effects of the filtering section 34, Eigen-modes were simulated, including the mode profile and the cavity resonance frequency as a function of the waveguide width for the full set of mode families (see FIG. 12). When the waveguide width is narrowed down below 0.8 µm, higher order modes are cut-off, leaving only the two fundamental mode families ($TE_{00}$, $TM_{00}$). Regions of "mixed-shape" mode profiles were also observed. The set of exemplary SiN microresonators studied here have a waveguide height of 0.8 µm and a nominal width of 1.65 µm such that anomalous GVD is produced over a wide wavelength span. The FSR is 100 GHz. The taper waist in the filtering section 34 ranges from 0.45 µm to the nominal width and the taper length is fixed to be 130 µm. It should be noted that the parameter of the waveguide width has an undetermined offset in the range of ±30 nm, induced during the microfabrication process.

The optical device 30 includes a waveguide comprising at least one multimode waveguide 38 for propagating an electromagnetic wave along a propagation direction of the multimode waveguide 38, and at least one optical mode filtering device 34 connected to the at least one multimode waveguide 38 to receive the propagated electromagnetic wave from the at least one multimode waveguide 38 and to provide a filtered electromagnetic wave to the at least one multimode waveguide 38. The multimode waveguide 38 and the optical mode filtering device 34 can be integrally formed or of unitary construction.

The optical mode filtering device 34 is configured to provide different propagation conditions for different mode families to suppress one or more mode families. The optical mode filtering device 34 includes a filtering waveguide, for propagating an electromagnetic wave along a propagation direction, and configured to provide different propagation conditions for different mode families to suppress one or more mode families.

The filtering waveguide of the optical mode filtering device 34 is tapered inwardly along the propagation direction (for example, clockwise in the ring resonator of FIG. 9) from a first outer extremity E1 of the waveguide of the optical mode filtering device 34 and is then tapered outwardly along the propagation direction to a second outer extremity E2 of the waveguide of the optical mode filtering device 34.

The optical mode filtering device is cross-sectionally tapered. The optical mode filtering device 34 is tapered to a cross-sectional waveguide width and height that permits a single mode electromagnetic propagation. For example, the distance between side walls of the optical mode filtering device 34 is reduced so that the walls become closer to each other. The base or bottom of the optical mode filtering device 34 can also change along the length of the optical mode filtering device 34 and rises to reduce the height of the core material in the optical mode filtering device 34.

Figure 11A:
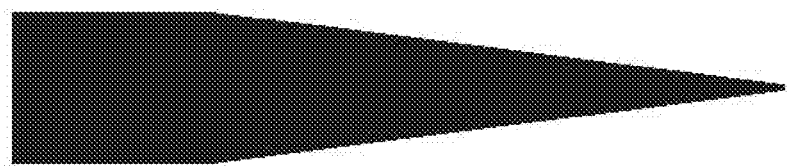
FIG. 11a shows a section of an optical mode filtering device that is tapered linearly.
Figure 11B:
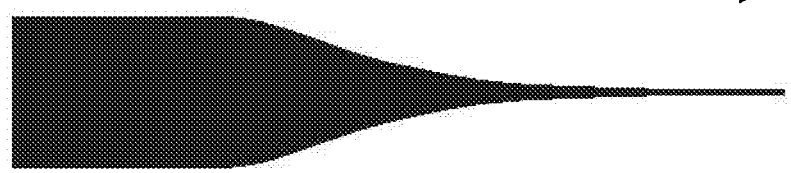
FIG. 11b shows a section of an optical mode filtering device that is tapered non-linearly.

The filtering waveguide of the optical mode filtering device 34 can be tapered non-linearly or linearly along the propagation direction from the boundary with the multimode waveguide 38 (see FIG. 11). The waveguide of the optical mode filtering device 34 can be tapered non-linearly or linearly inwardly along the propagation direction, for example, from the boundary E1, and tapered non-linearly or linearly outwardly along the propagation direction to the boundary E2 with the multimode wave guide 38.

The waveguide of the optical mode filtering device may for example be tapered and continuous in a first and second derivative along the propagation direction from a boundary with the multimode waveguide. The filtering waveguide of the optical mode filtering device 34 can be tapered and the width evolution along the propagation direction from a boundary with the multimode waveguide is given by the following equation:

$$w(\varphi) = \frac{w_n + w_t}{2} - \frac{w_n - w_t}{2} \cos\left(\pi \left(\frac{2r\varphi}{l_t}\right)^3\right)$$

where $l_t$ is a taper length, N being any number between 1 to 50, r is a resonator radius, $w_n$ is a nominal width of the multimode waveguide, $w_t$ is a minimal width at the taper waist.

$$r \cdot \varphi \in \left[-\frac{l_t}{2}, \frac{l_t}{2}\right]$$

where $\varphi$ is an angular coordinate and $\varphi=0$ indicating the position of the taper waist.

A width W of the filtering waveguide of the optical mode filtering device 34 is, for example, tapered down to a value W in the range 150 nm≤W≤5 µm or 50 nm≤W≤5 µm. A height H of the filtering waveguide of the optical mode filtering device 34 is, for example, in the range 150 nm≤H≤2 µm or 50 nm≤H≤2 µm. A length L of the filtering waveguide of the optical mode filtering device 34 is, for example, in the range 50 µm≤L≤5 µm or 50 µm≤L≤2.5 µm.

The width of the waveguide of the optical mode filtering device 34 is preferably tapered down to 0.8 µm or less and more preferably is tapered down to a value W in the range 0.45 µm≤W≤0.8 µm. The length L of the waveguide is preferably in the range 50 µm≤L≤150 µm. The height H of the waveguide of the optical mode filtering device 34 and of the multimode waveguide is ≥0.7 µm.

The waveguide of the optical device 30, 32 can be configured to produce anomalous or normal dispersion. The waveguide forms a closed loop or ring, that is, the multimode waveguide 38 and the optical mode filtering device 34 form a closed loop or ring. The optical device can be a non-linear optical device or a frequency comb generating optical device. The optical device is configured to provide an optical quality Q factor greater than $1 \times 10^6$.

The multimode waveguide 38 and the optical mode filtering device 34 comprises or is formed of, for example, Silicon nitride (SiN) or Aluminum Nitride (AlN). The multimode waveguide 38 and the optical mode filtering device 34 can be encladded in Silicon dioxide.

The optical mode filtering device 34 is configured to carry out an adiabatic transition of the propagating electromagnetic wave from multimode electromagnetic wave propagation to single mode electromagnetic wave.

Figure 9A:
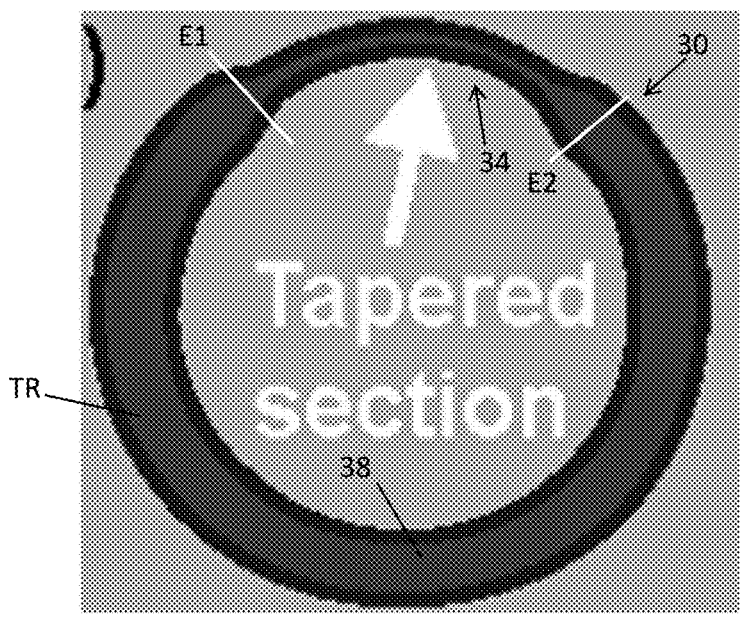
FIG. 9a shows an optical device comprising a tapered resonator.
Figure 9B:
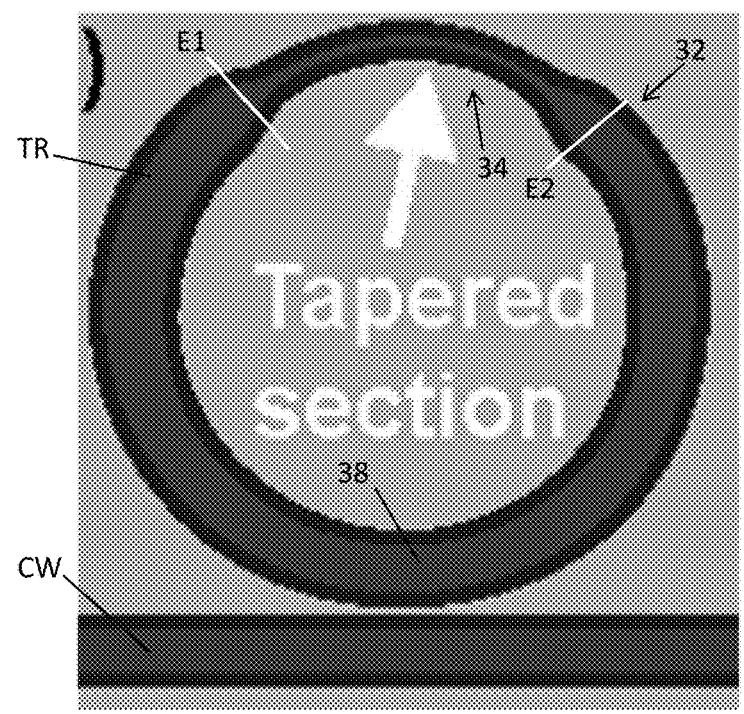
FIG. 9b shows an optical device comprising a tapered resonator and a coupling waveguide.

The optical device 32 of FIG. 9b is identical to the device 30 of FIG. 9a but further includes at least one coupling waveguide CW optically coupled to the multimode waveguide 38 permitting optical communication with the multimode waveguide 38.

The tapered microresonator devices 30, 32 can be fabricated using the above described waveguide fabrication method or photonic Damascene Process. To produce the optical mode filtering device 34, the width (distance between the side walls) of the waveguide recess structure 16a of the mask is reduced over a predetermined distance along the waveguide recess structure length. A dry etch (for example, using $CHF_3$ and He mentioned previously) to pattern the cladding layer is carried out and allows to taper/reduce the dimensions of waveguide recess structure 4 (or waveguide core of the optical mode filtering device 34) not only horizontally (along the planar direction or along the width W of the waveguide recess structure 4 or the waveguide core) but also vertically (along a direction substantially perpendicular to the planar direction or along the depth or height H of the waveguide recess structure 4 or waveguide core).

Figure 18:
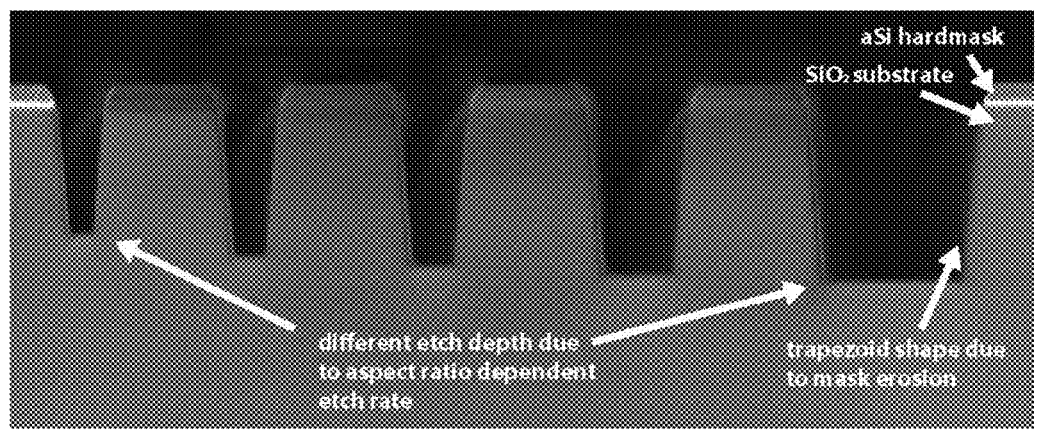
FIG. 18 shows how etching using narrower mask openings or widths produces smaller etch depth as well a smaller etch widths or distance between side walls.

The dry etch velocity in the vertical direction and thus the depth of the etch in the vertical direction depends on the width of the waveguide recess structure 16a of the mask. This is shown in FIG. 18 where etching using narrower mask openings or widths produce smaller etch depth as well a smaller distance between side walls.

For the optical mode filtering device 34 of FIGS. 9 and 10, the width or opening of the waveguide recess structure 16a of the mask is reduced over a first length starting from location E1 and then increased over a second length up until location E2. Over this length, after etching, the distance W between the side walls the waveguide recess structure 4 or the waveguide core of the optical mode filtering device 34 firstly reduces from E1 and then increases back to substantially the original width at E2. Additionally, the base or bottom of the waveguide recess structure 4 or the waveguide core of the optical mode filtering device 34 rises from E1 to reduce the height H of the waveguide recess structure 4 or the core material in the optical mode filtering device 34 and then lowers and to substantially the original depth or height at E2.

The multimode waveguide 38 and the optical mode filtering device 34 as well as the coupling waveguide CW are located in the same plane. The optical device 30, 32 can further includes a stress release structure or pattern 26 (FIG. 10) enclosing the multimode waveguide 38, the optical mode filtering device 34 and the coupling waveguide CW.

A separation zone can be included between the stress release structure 26 and the multimode waveguide 38 and the optical mode filtering device 34. The separation zone separates the stress release structure 26 and the multimode waveguide 38 (or the optical mode filtering device 34) by a distance D where 50 μm<D<2 μm.

The stress release structure 26 includes a plurality of indentations 10 formed in a first layer comprising a first material, the indentations 10 being filled by a second material different to the first material. A core of the multimode waveguide is formed using the second material. The second material can be, for example, Silicon nitride (SiN) or Aluminum Nitride (AlN) and the first material can be, for example, Silicon dioxide ($SiO_2$). The optical device 30, 32 can, for example, include a substrate layer comprising silicon, $MgF_2$ or $CaF_2$.

A depth of the indentations 10 is substantially equal to or greater than a depth or height H of the multimode waveguide. The plurality of indentations can be regularly or irregularly spaced one from the other across said first layer. The plurality of indentations can form at least one repeating pattern of indentations across the first layer. The plurality of indentations can form, for example, a checkerboard structure or layout across the layer. The checkerboard structure can include tiles 28 that are regularly or irregularly spaced. The tiles 28 can be rectangular in cross-sectional shape, for example, 5 μm×5 μm, but also be of a non-rectangular shape, for example, circular or hexagonal. The plurality of indentations can extends over the entire first layer.

A height H of the multimode waveguide 38 and the filtering waveguide of the optical mode filtering device 34 can be, for example, between 600 nm and 1.5 μm to permit anomalous dispersion at wavelengths longer than 1 μm. The multimode waveguide 38 and the filtering waveguide may include smoothed waveguide walls formed by an oxide reflow to reduce the optical losses of the waveguide.

Another aspect of the present invention relates to a photonic chip including the optical device 30 or optical device 32. Moreover, another aspect of the present invention relates to an optical mode suppression method for suppressing optical modes of an electromagnetic wave in an anomalous dispersion resonator. The method can include the steps of providing at least one multimode waveguide 38 for propagating the electromagnetic wave along a propagation direction, and providing at least one optical mode filtering device 34 connected to the at least one multimode waveguide 38 to receive the propagated electromagnetic wave from the at least one multimode waveguide 38 and to provide a filtered electromagnetic wave to the at least one multimode waveguide 38.

An electromagnetic wave is generated in the multimode waveguide 38 and a filtered electromagnetic wave of the multimode waveguide 38 is retrieved. The optical device is, for example, a non-linear optical device or a frequency comb generating optical device.

Figure 13A:
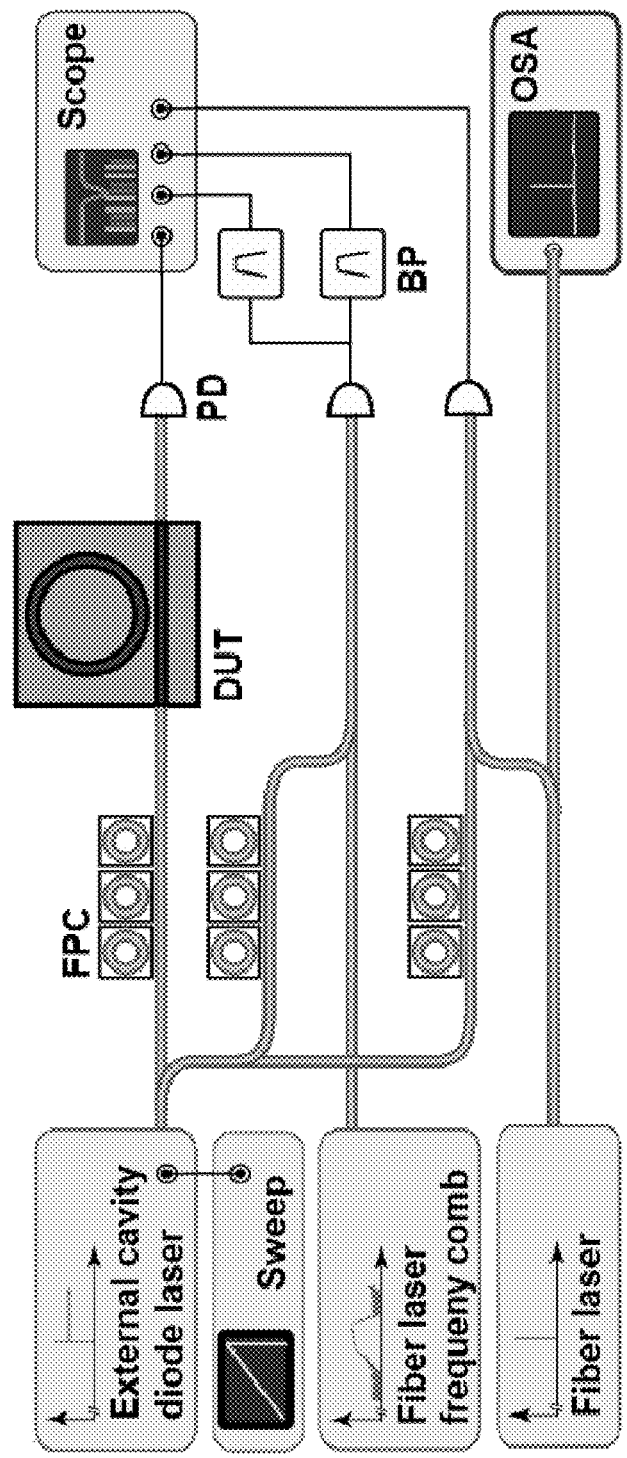
FIG. 13a shows a setup of frequency comb assisted tunable laser spectroscopy where DUT: device under test, ECDL: external cavity diode laser, PD: photodiode, BP: band pass filter, OSA: optical spectral analyzer.

SiN microresonators were characterized using frequency comb assisted tunable laser spectroscopy. FIG. 13a shows the setup that makes use of two beat signals—the probe (ECDL) with (1) a self-referenced and phase stabilized fiber laser frequency comb and with (2) a continuous wave laser—to calibrate the frequency axis and therefore, precisely measure resonance frequencies and linewidths of the microresonator. A fiber polarization controller at the microresonator input enables the measurement of mode families of all polarizations.

Resonance frequencies with ωμ are defined with respect to a central resonance $$\omega 0 \text{ as } \omega_\mu = \omega_0 + D_1\mu + \frac{1}{2}D_2\mu^2 + \ldots$$

frequency where μ is the relative mode number $$\frac{D_1}{2\pi}$$

is the FSR, $$D_2 = -\frac{c}{n}D_1^2\beta_2$$

is the second order dispersion parameter. A positive-valued $D_2$ implies that the microresonator is in the anomalous GVD regime with $\beta_2<0$. Integrated dispersion $D_{int}$ is described as the deviation of the resonance frequencies compared to an equidistant $\tilde{D}_1$-spaced grid, i.e. $D_{int}=\omega_\mu-\omega_0-\tilde{D}_1\mu$.

The characterization of a standard resonator with constant waveguide width (FIGS. 14a to 14d) is compared to one including the mode filtering section with $\omega_t=0.45$ am (tapered resonator, FIGS. 14e to 14h). Mode family spectra are detected for both resonators (FIG. 14a, FIG. 14e).

Two fundamental mode families are identified and one higher order mode for the standard resonator, i.e. $TE_{00}$, $TM_{00}$ and $TE_{10}$, while in the tapered resonator the higher order mode is suppressed. The transmission trace of the standard resonator, FIG. 14c, shows the higher order $TE_{10}$ mode that has Fano resonance shape, together with the fundamental $TE_{00}$ mode that has narrower resonance linewidths. The oscillating background is induced by the Fabry-Perot interference between the two chip facet. The $TE_{00}$ mode has the largest FSR according to simulations, which is measured to be ~96 GHz.

However, in the transmission trace of the tapered resonator, FIG. 14g, resonances of $TE_{10}$ mode are not observed. The FSR of the two fundamental modes remain approximately unchanged compared to the standard resonator. On the other hand, the $D_2$ parameter is reduced by introducing the mode filtering section, since the tapered waveguide section will contribute a small amount of normal GVD to the overall cavity dispersion. In the shown case, $D_2/2\pi$ near 1550 nm is reduced from ~1.0 MHz (standard waveguide) to ~0.8 MHz (tapered resonator). Still, the tapered resonator is in the anomalous GVD regime that is necessary for the formation of dissipative Kerr soliton.

Since different modes have different FSRs, they show distinct slopes in the mode spectrum. Therefore, mode families cross with each other, implying resonances of two mode families are getting close at certain frequencies (crossing points), see FIG. 14a, FIG. 14e. It is at such frequencies that avoided modal crossings appear. This can lead to strong local deviations from the parabolic curvature of the integrated dispersion, see FIG. 14b for the $TE_{00}$ mode family of the standard resonator. In the tapered resonator, avoided modal crossings are much suppressed, see FIG. 14f, by filtering out the higher order mode.

Figure 13B:
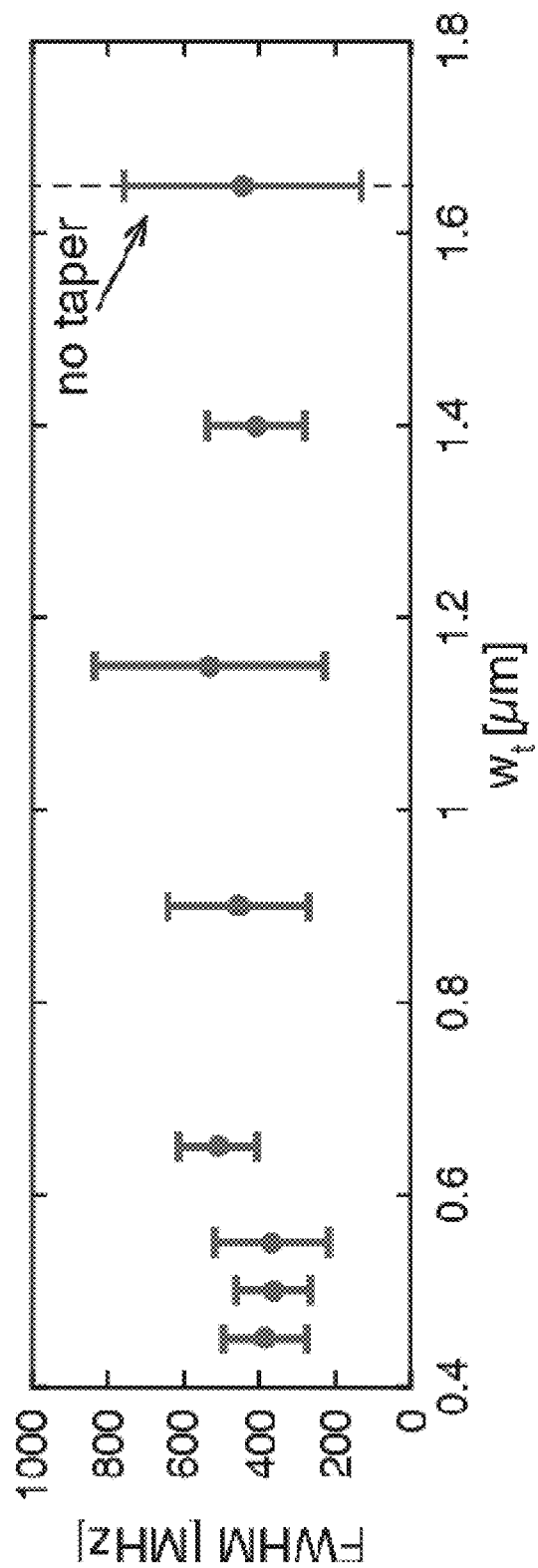
FIG. 13b shows a mean value and standard deviation of the resonance linewidth, over the measurement wavelength range 1.51-1.61 μm, as a function of the width at the tapered waist $w_t$.

The resonance linewidth distribution was also investigated over the whole measurement wavelength range 1.51-1.61 μm, see FIG. 14d, FIG. 14h. Both standard and tapered resonators have a similar distribution that can be fitted with a general Burr probability distribution function in order to account for the mean value and the standard deviation of the resonance linewidth. A careful investigation of the resonance linewidth over different waveguide widths is shown in FIG. 13b, with all resonators having the same coupling geometry and being almost critically coupled. This demonstrates that including a modal filtering section in SiN microresonators will not degrade the resonance Q factor (for values of $10^6$).

Figure 15A:
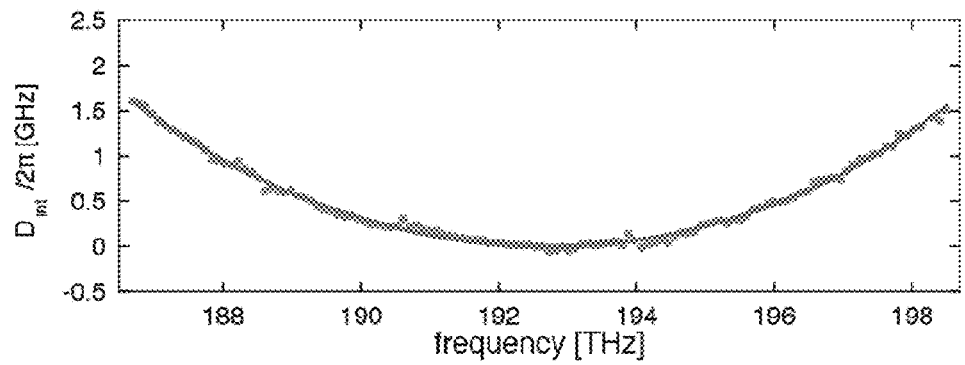
FIG. 15a shows an integrated dispersion $D_{int}$ of a SiN microresonator with a filtering section, with the taper waist $w_t$=0.5 μm yielding a measured anomalous GVD parameter of $D_2/2\pi \approx 0.8$ MHz.
Figure 15B:
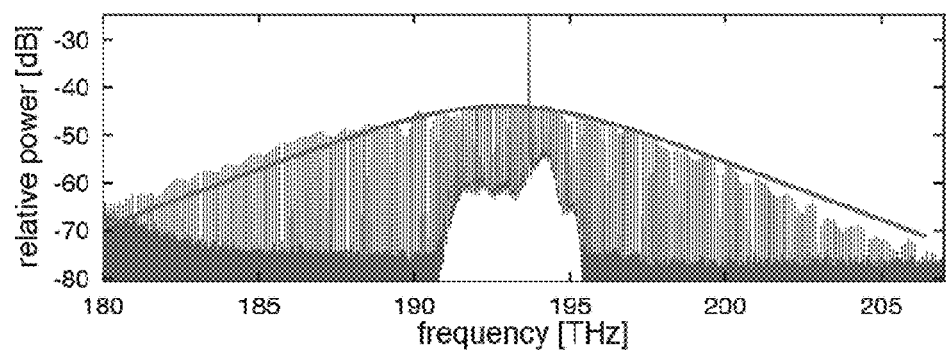
FIG. 15b shows a frequency comb with single dissipative Kerr soliton formation; the spectrum is fitted with a sech$^2$ function; the 3-dB bandwidth is around 6.4 THz; the soliton comb envelope has an offset of ~0.95 THz from the pump.

Kerr frequency comb generation based on temporal dissipative Kerr soliton formation is obtained in such a SiN microresonator with a filtering section. A laser detuning scheme was applied, in which the pump laser frequency is swept over a resonance of a fundamental mode and is stopped when the frequency comb generation is in the stable soliton state. One can also apply the "power kick" used in previous work on soliton formation in SiN resonators. FIG. 15b shows the generated soliton comb in a 100 GHz microresonator with a taper waist $w_t=0.5$ μm. The corresponding integrated dispersion $D_{int}$ is shown in FIG. 15a. The experiment employed 1 W of continuous wave pump light (at 1548 nm) in the waveguide.

The soliton comb has a spectral span of ~25 THz. The 3-dB bandwidth is ~6.4 THz corresponding to the Fourier limited pulse duration of ~48 fs. The frequency comb spectral envelope is fitted with a $sech^2$ profile and reveals a slight asymmetry. The asymmetric spectral envelope is attributed to the third order dispersion ($D_3/2\pi$=O(1) kHz) as well as the self-steepening effects of the microresonator, which induces asymmetry in the parabolic curvature in the dispersion. Moreover, the soliton spectral envelope shows an offset of ~0.95 THz from the pump, which is attributed to the Raman induced soliton self-frequency shift as the intracavity soliton is estimated to have an intense peak power (O(1) kW).

Consequently, this new resonator layout featuring a single mode filtering section for an integrated SiN platform preserves the high Q and the anomalous GVD of the silicon nitride resonator, and effectively suppresses avoided modal crossings caused by the interaction of higher order transverse modes of the waveguide of the micro-ring resonator. This realizes an effectively single-mode micro-ring resonator with anomalous GVD. These new devices show significantly reduced local dispersion deviation due to avoided crossings. The design enables reliable generation of temporal dissipative Kerr solitons. The approach is particularly useful for low free-spectral range resonators, or resonators with large number of transverse modes.

Figure 16:
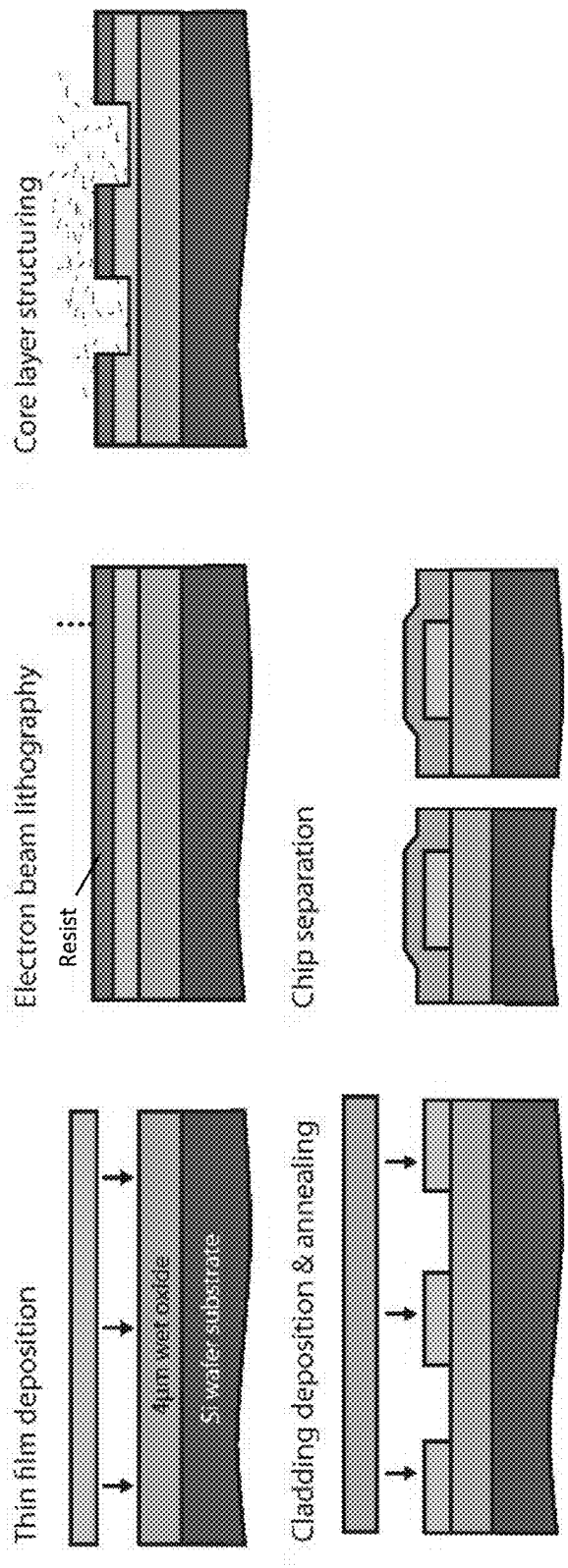
FIG. 16 shows an alternative method for producing the optical device of FIGs.
Figure 17A:
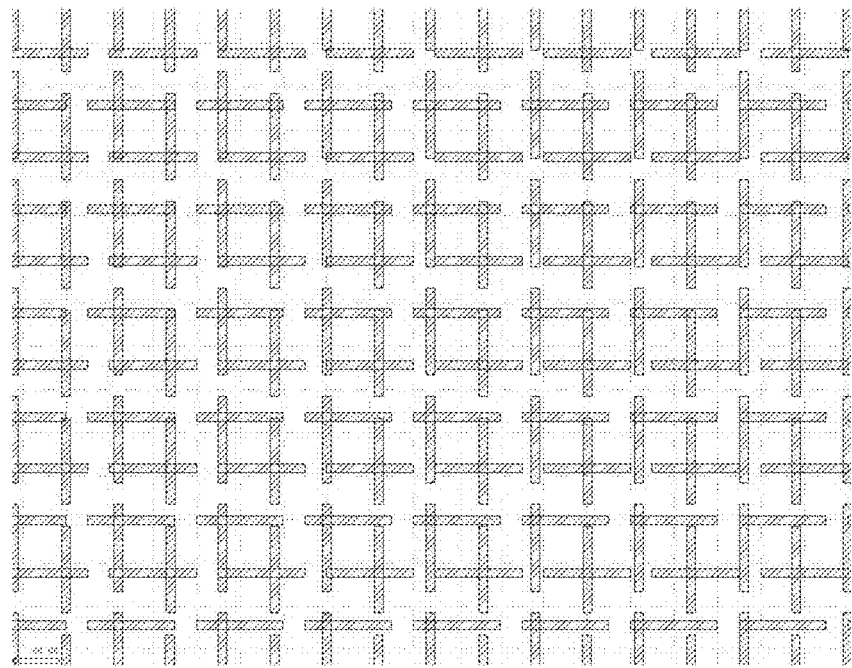
FIGS. 17a to 17d shows different stress release structure layouts or patterns (the dotted lines are for illustration purposes and not part of the layout or pattern.
Figure 17B:
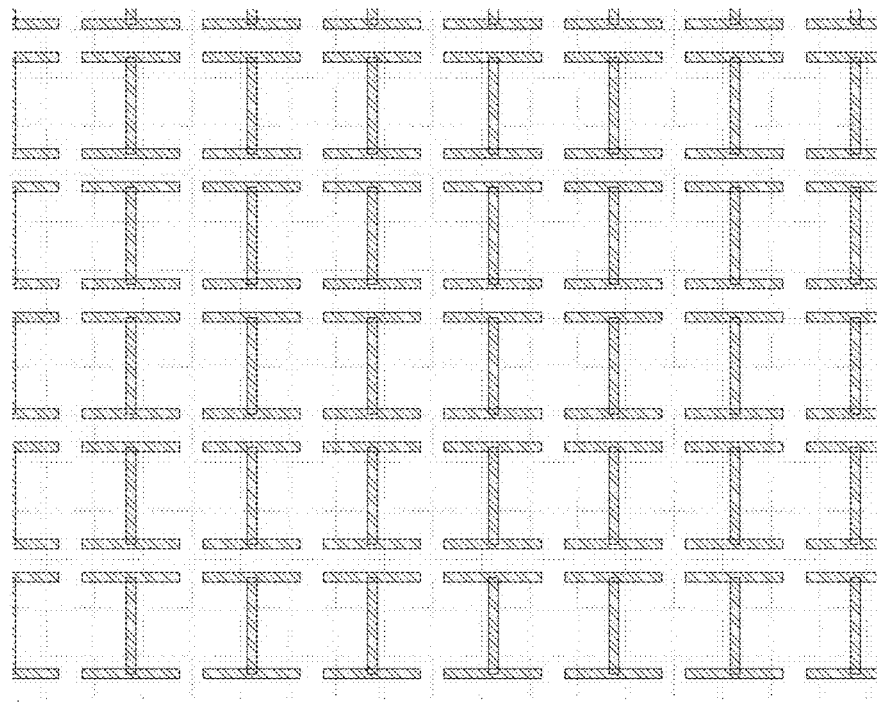
Figure 17C:
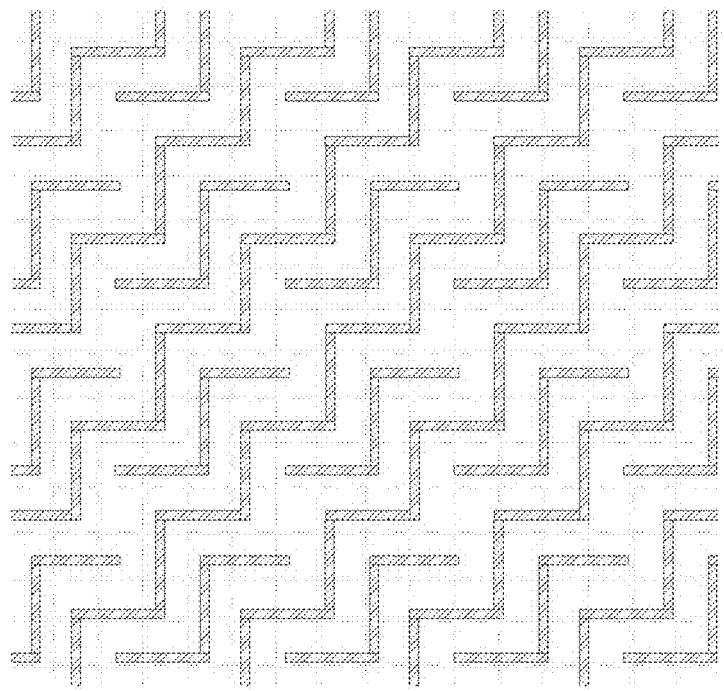
Figure 17D:
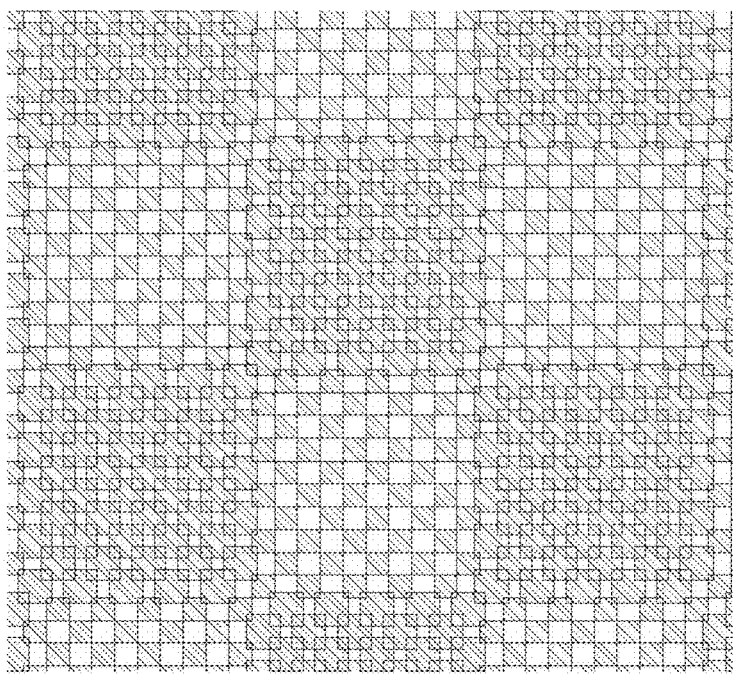

FIG. 16 shows an alternative method for producing the optical device 30, 32. The method of FIG. 16 is the so called "subtractive process approach". In this approach, the thin film of interest (e.g. SiN) is first deposited and then structured into waveguides. The bare substrates are coated with the thin film of interest, for example, with a silicon nitride thin film. Then using electron beam lithography a deposited resist layer is structured to define the waveguide patterns. Using an etch process, typically anisotropic dry etching (reactive ion etching), the thin film that will form the waveguide core is structured. After resist stripping, additional cleaning and annealing steps, a protective cladding thin film is deposited. Finally the wafer is optionally separated into dies.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

The invention claimed is:

1. A waveguide fabrication method including the steps of:
providing a substrate including a waveguide recess structure to receive a waveguide material for forming a waveguide and a stress release recess structure, the stress release recess structure arranged along both sides of a channel formed by the waveguide recess structure to enclose the waveguide recess structure; and
depositing the waveguide material onto the substrate and into the waveguide recess structure and the stress release recess structure.

2. The method according to claim 1 further including the step of:
planarizing the deposited waveguide material.

3. The method according to claim 2 further including the step of:
depositing a cladding layer onto the planarized waveguide material.

4. The method according to claim 3 wherein the waveguide material includes Silicon nitride (SiN) or Aluminum Nitride (AlN) and the waveguide recess structure and the stress release recess structure of the substrate are formed in Silicon dioxide ($SiO_2$), and the cladding layer includes Silicon dioxide ($SiO_2$).

5. The method according to claim 2 wherein the step of planarizing is carried out using mechanical planarization and chemical planarization.

6. The method according to claim 2 wherein a height of the waveguide material deposited in the waveguide recess structure after the step of planarizing is between 600 nm and 1.5 μm to permit anomalous dispersion at wavelengths longer than 1 μm.

7. The method according to claim 1 further including the step of:

applying thermal energy to the substrate, before the step of depositing, to permit reflow of an exposed surface of the waveguide recess structure to lower optical losses of the waveguide.

8. The method according to claim 1 wherein the stress release recess structure includes a plurality of indentations formed in the substrate.

9. The method according to claim 8 wherein a depth of the indentations of the plurality of indentation of the stress release recess structure measured from an outer surface of the substrate is substantially equal to or greater than a depth of the waveguide recess structure measured from the outer surface of the substrate.

10. The method according to claim 8 wherein the plurality of indentations are regularly or irregularly spaced one from the other on the substrate.

11. The method according to claim 8 wherein the plurality of indentations include a repeating pattern of indentations across the substrate.

12. The method according to claim 8 wherein the plurality of indentations include a checkerboard structure or layout across the substrate.

13. The method according to claim 1 wherein the substrate further includes a recess-free zone between the stress release recess structure and the channel formed by the waveguide recess structure.

14. The method according to claim 13 wherein the recess-free zone separates the stress release recess structure and the waveguide recess structure by a distance in a range between 2 μm and 50 μm.

15. The method according to claim 1 wherein the waveguide recess structure and the stress release recess structure are located in a same plane.

16. The method according to claim 1 further including the step of:
providing a hard mask layer including a waveguide recess structure and a stress release recess structure and forming the waveguide recess structure and the stress release recess structure in the substrate using said hard mask layer and a dry plasma etch or a wet etch.

17. The method according to claim 16 wherein the hard mask layer includes amorphous silicon (aSi).

18. The method according to claim 1 wherein the waveguide recess structure is tapered.

19. The method according to claim 1, wherein the step of depositing the core waveguide material onto the substrate simultaneously fills both the waveguide recess structure and the stress release recess structure.

20. The method according to claim 1, wherein the step of depositing the waveguide material onto the substrate and into both the waveguide recess structure and the stress release recess structure forms a continuous waveguide material layer on the substrate.

21. A waveguide fabrication method including the steps of:
providing a substrate including a waveguide recess structure and a stress release recess structure for receiving a waveguide material; and
depositing the waveguide material onto the substrate and into both the waveguide recess structure and the stress release recess structure,
wherein the step of depositing the waveguide material onto the substrate simultaneously fills both the waveguide recess structure and the stress release recess structure.

* * * * *